(12) United States Patent
Mou et al.

(10) Patent No.: US 11,478,794 B2
(45) Date of Patent: Oct. 25, 2022

(54) MICRO CHANNEL STRUCTURE

(71) Applicant: Microjet Technology Co., Ltd., Hsinchu (TW)

(72) Inventors: Hao-Jan Mou, Hsinchu (TW); Rong-Ho Yu, Hsinchu (TW); Cheng-Ming Chang, Hsinchu (TW); Hsien-Chung Tai, Hsinchu (TW); Wen-Hsiung Liao, Hsinchu (TW); Chi-Feng Huang, Hsinchu (TW); Yung-Lung Han, Hsinchu (TW); Chun-Yi Kuo, Hsinchu (TW)

(73) Assignee: MICRO JET TECHNOLOGY CO., LTD., Hsinchu (TW)

( * ) Notice: Subject to any disclaimer, the term of this patent is extended or adjusted under 35 U.S.C. 154(b) by 554 days.

(21) Appl. No.: 16/660,890

(22) Filed: Oct. 23, 2019

(65) Prior Publication Data

US 2020/0139368 A1 May 7, 2020

(30) Foreign Application Priority Data

Nov. 7, 2018 (TW) ................................ 107139569

(51) Int. Cl.
*B01L 3/00* (2006.01)
*F04B 43/04* (2006.01)
*F16K 99/00* (2006.01)

(52) U.S. Cl.
CPC ... *B01L 3/502738* (2013.01); *B01L 3/502715* (2013.01); *F04B 43/046* (2013.01);
(Continued)

(58) Field of Classification Search
CPC ............ B01L 3/5027; B01L 3/502738; B01L 3/502715; B01L 3/502707;
(Continued)

(56) References Cited

U.S. PATENT DOCUMENTS

| 6,290,861 B1 * | 9/2001 | Silverbrook ..... G06K 19/06037 |
| | | 216/27 |
| 6,720,710 B1 * | 4/2004 | Wenzel ................. F04B 43/046 |
| | | 417/474 |

(Continued)

FOREIGN PATENT DOCUMENTS

| CN | 102979705 A | 3/2013 |
| CN | 104246228 A | 12/2014 |

(Continued)

OTHER PUBLICATIONS

Extended European Search Report, dated Jun. 19, 2020, for European Application No. 19204849.4.

*Primary Examiner* — Brian J. Sines
(74) *Attorney, Agent, or Firm* — Birch, Stewart, Kolasch & Birch, LLP

(57) ABSTRACT

A micro channel structure includes a substrate, a supporting layer, a valve layer, a second insulation layer, a vibration layer and a bonding-pad layer. A flow channel is formed on the substrate. A conductive part and a movable part are formed on the supporting layer and the valve layer, respectively. A first chamber is formed at the interior of a base part and communicates to the hollow aperture. A supporting part is formed on the second insulation layer. A second chamber is formed at the interior of the supporting layer and communicates to the first chamber through the hollow aperture. A suspension part is formed on the vibration layer. By providing driving power sources having different phases to the bonding-pad layer, the suspension part moves upwardly and downwardly, and a relative displacement is generated between the movable part and the conductive part, to achieve fluid transportation.

14 Claims, 21 Drawing Sheets

(52) U.S. Cl.
CPC ...... *F16K 99/0048* (2013.01); *F16K 99/0051* (2013.01); *B01L 3/502707* (2013.01); *B01L 2300/0887* (2013.01); *B32B 2307/202* (2013.01); *B32B 2307/206* (2013.01); *B81B 2203/0338* (2013.01); *F16K 2099/008* (2013.01); *F16K 2099/0074* (2013.01)

(58) Field of Classification Search
CPC .......... B01L 2300/0887; F04B 43/046; F16K 99/0048; F16K 2099/008; F16K 99/0051; F16K 2099/0074; B81B 2203/0338
See application file for complete search history.

(56) References Cited

U.S. PATENT DOCUMENTS

| | | |
|---|---|---|
| 2002/0050148 A1 | 5/2002 | Shyy et al. |
| 2006/0147329 A1 | 7/2006 | Tanner |
| 2012/0093700 A1 | 4/2012 | Pesaturo et al. |

FOREIGN PATENT DOCUMENTS

| | | |
|---|---|---|
| CN | 102308090 B | 12/2015 |
| CN | 107023456 A | 8/2017 |
| CN | 108281401 A | 7/2018 |
| CN | 108457846 A | 8/2018 |
| KR | 10-2014-0081570 A | 7/2014 |
| TW | 200618100 A | 6/2006 |
| TW | M562342 U | 6/2018 |
| TW | I635041 B | 9/2018 |
| WO | WO 2017/002094 A1 | 1/2017 |

\* cited by examiner

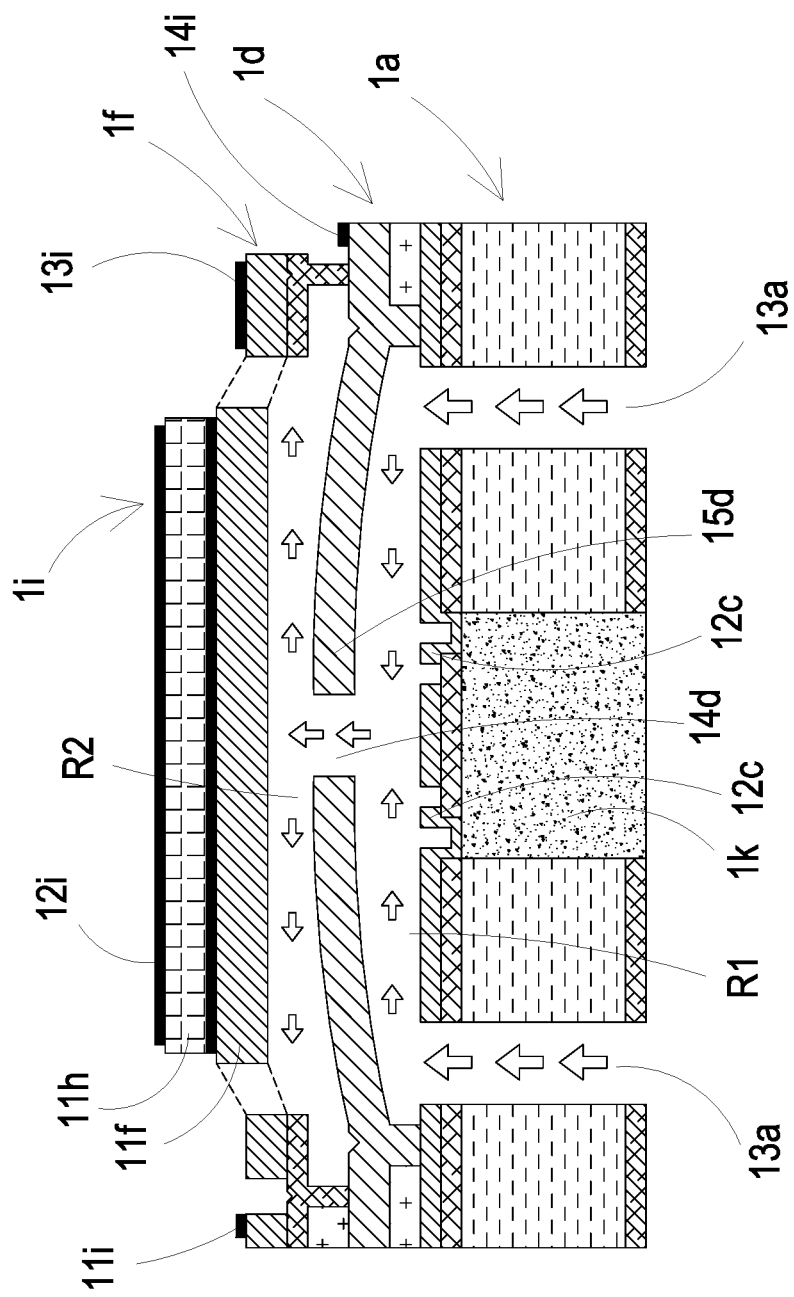

MICRO CHANNEL STRUCTURE

FIELD OF THE DISCLOSURE

The present disclosure relates to a micro channel structure, and more particularly to a micro channel structure driven by electric energy.

BACKGROUND OF THE DISCLOSURE

Currently, in all fields, the products used in many sectors such as pharmaceutical industries, computer techniques, printing industries or energy industries are developed toward elaboration and miniaturization. The fluid transportation devices are important components that are used in for example micro pumps, micro atomizers, printheads or the industrial printers.

With the rapid advancement of science and technology, the application of fluid transportation device tends to be more and more diversified. For the industrial applications, the biomedical applications, the healthcare, the electronic cooling and so on, even the most popular wearable devices, the fluid transportation device is utilized therein. It is obviously that the conventional fluid transportation devices gradually tend to miniaturize the structure and maximize the flow rate thereof.

In the prior art, the miniaturized fluid transportation structure has been made by micro-electromechanical system (MEMS) process and integrally formed into one piece. However, when in use, the conventional miniaturized fluid transporting structure fails to be implanted to transport the gas due to different ways of actions. Therefore, how to utilize an innovative miniaturized fluid transporting structure to break through the bottleneck of the prior art has become an important part of development.

SUMMARY OF THE DISCLOSURE

The object of the present disclosure is to provide a micro channel structure. The micro channel structure of the present disclosure is driven by electric energy and capable of transporting gas. Since the micro channel structure of the present disclosure is produced by a standard micro-electromechanical system process, the costs of development and mass production are low. Moreover, the structural size and flatness of the micro channel structure of the present disclosure are stable, and it benefits from making the reliability and service life of the operation increase.

In accordance with an aspect of the present disclosure, there is provided a micro channel structure. The micro channel structure includes a substrate, a first insulation layer, a supporting layer, a valve layer, a second insulation layer, a vibration layer, a low electrode layer, a piezoelectric actuation layer, a bonding-pad layer, and a mask layer. The substrate has a first surface, a second surface, at least one flow channel and a receiving slot, wherein the at least one flow channel and the receiving slot are formed by etching. The first insulation layer is formed on the first surface of the substrate by deposition and etched to expose the at least one flow channel of the substrate. The supporting layer is formed on the first insulation layer by deposition, has a protruding part and a conductive part formed by etching and is etched to expose the at least one flow channel of the substrate. The valve layer is formed on the supporting layer by deposition and has a base part with a height, a movable part, a fixed part, and a hollow aperture formed by etching, wherein a first chamber is formed within the interior of base part, the hollow aperture is formed on the valve layer and located at a position corresponding to the protruding part of the supporting layer, the hollow aperture and the first chamber are in fluid communication with each other, the movable part extends from the periphery of the hollow aperture to the base part, and the fixed part extends from the base part and away from the movable part. The second insulation layer is formed on the valve layer by deposition and having a supporting part with a height formed by etching, wherein a second chamber is formed within the interior of the supporting part, and the second chamber and the first chamber are in fluid communication with each other through the hollow aperture of the valve layer. The vibration layer is formed on the second insulation layer by deposition and has a suspension part, an outer frame, at least one connection part and a bonding-pad part formed by etching, wherein the at least one connection part is formed between the suspension part and the outer frame, to provide a supporting force to elastically support the suspension part, at least one gap is formed among the suspension part, the outer frame and the at least one connection part, and the bonding-pad part is spaced apart and free of electrical connection with the suspension part, the outer frame and the at least one connection part. The lower electrode layer is disposed on the vibration layer by deposition and formed on the suspension part by etching. The piezoelectric actuation layer is formed on the lower electrode layer by deposition and etching. The bonding-pad layer is formed on the valve layer, the vibration layer and the piezoelectric actuation layer by deposition and etching, wherein a reference electrode bonding pad is formed on the bonding-pad part of the vibration layer, an upper electrode bonding pad is formed on the piezoelectric actuation layer, a lower electrode bonding pad is formed on a lateral side of the outer frame of the vibration layer, and a valve-layer electrode bonding pad is formed on the fixed part of the valve layer. The mask layer is formed on the second surface of the substrate by deposition and etched to expose the at least one flow channel and the receiving slot of the substrate, wherein the receiving slot and the conducive part of the supporting layer are in electrical connection with each other, and a base electrode bonding pad is formed by filling a polymer conductive material into the receiving slot, so that the base electrode bonding pad and the conducive part of the supporting layer are in electrical connection with each other. Driving power sources having different phases are provided to the reference electrode bonding pad, the upper electrode bonding pad, the lower electrode bonding pad, the valve-layer electrode bonding pad and the base electrode bonding pad, so as to drive and control the suspension part of the vibration layer to displace upwardly and downwardly, and a relative displacement is generated between the movable part of the valve layer and the conductive part of the supporting layer, so that a fluid is inhaled through the at least one flow channel, flows into the first chamber, is converged in the second chamber through the hollow aperture of the valve layer, and is compressed to be discharged out to achieve fluid transportation.

The above contents of the present disclosure will become more readily apparent to those ordinarily skilled in the art after reviewing the following detailed description and accompanying drawings, in which:

BRIEF DESCRIPTION OF THE DRAWINGS

FIGS. 4B to 4D are cross sectional views illustration actions of the micro channel structure of the present disclosure.

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
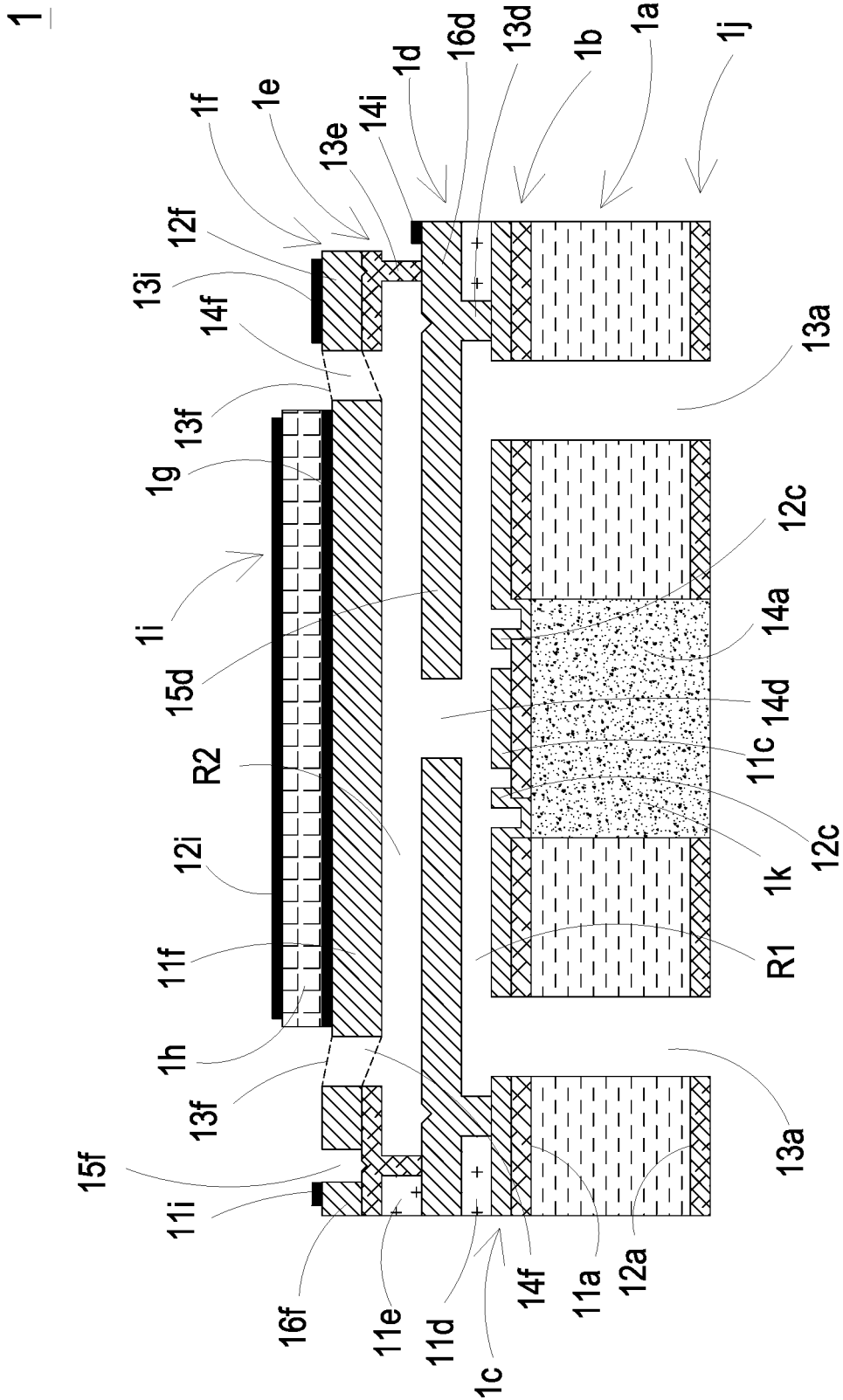
FIG. 1 is a cross sectional view illustrating a micro channel structure according to an embodiment of the present disclosure.

Please refer to FIG. 1. The present disclosure provides a micro channel structure 1 including at least one substrate 1a, at least one first surface 11a, at least one second surface 12a, at least one receiving slot 14a, at least one first insulation layer 1b, at least one supporting layer 1c, at least one protruding part 11c, at least one conductive part 12c, at least one valve layer 1d, at least one base part 13d with a height, at least one movable part 15d, at least one fixed part 16d, at least one hollow aperture 14d, at least one first chamber R1, at least one second insulation layer 1e, at least one supporting part 13e, at least one second chamber R2, at least one vibration layer 1f, at least one suspension part 11f, at least one outer frame 12f, at least one bonding-pad part 16f, at least one low electrode layer 1g, at least one piezoelectric actuation layer 1h, at least one bonding-pad layer 1i, at least one reference electrode bonding pad 11i, at least one upper electrode bonding pad 12i, at least one lower electrode bonding pad 13i, at least one valve-layer electrode bonding pad 14i, at least one mask layer 1j and at least one base electrode bonding pad 1k. The numbers of the substrate 1a, the substrate 1a, the first surface 11a, the second surface 12a, the receiving slot 14a, the first insulation layer 1b, the supporting layer 1c, the protruding part 11c, the conductive part 12c, the valve layer 1d, the base part with the height, the movable part 15d, the fixed part 16d, the hollow aperture 14d, the first chamber R1, the second insulation layer 1e, the supporting part 13e with the height, the second chamber R2, the vibration layer 1f, the suspension part 11f, the outer frame 12f, the bonding-pad part 16f, the low electrode layer 1g, the piezoelectric actuation layer 1h, the bonding-pad layer 1i, the reference electrode bonding pad 11i, the upper electrode bonding pad 12i, the lower electrode bonding pad 13i, the valve-layer electrode bonding pad 14i, the mask layer 1j and the base electrode bonding pad 1k are exemplified by one for each respectively in the following embodiments but not limited thereto. It is noted that each of the substrate 1a, the substrate 1a, the first surface 11a, the second surface 12a, the receiving slot 14a, the first insulation layer 1b, the supporting layer 1c, the protruding part 11c, the conductive part 12c, the valve layer 1d, the base part with the height, the movable part 15d, the fixed part 16d, the hollow aperture 14d, the first chamber R1, the second insulation layer 1e, the supporting part 13e with the height, the second chamber R2, the vibration layer 1f, the suspension part 11f, the outer frame 12f, the bonding-pad part 16f, the low electrode layer 1g, the piezoelectric actuation layer 1h, the bonding-pad layer 1i, the reference electrode bonding pad 11i, the upper electrode bonding pad 12i, the lower electrode bonding pad 13i, the valve-layer electrode bonding pad 14i, the mask layer 1j and the base electrode bonding pad 1k can also be provided in plural numbers.

The micro channel structure of the present disclosure is used to transport fluid or gas and to increase or control the flow rate of the fluid or gas. Please refer to FIG. 1. In the embodiment, the micro channel structure 1 includes a substrate 1a, a first insulation layer 1b, a supporting layer 1c, a valve layer 1d, a second insulation layer 1e, a vibration layer 1f, a low electrode layer 1g, a piezoelectric actuation layer 1h, a bonding-pad layer 1i, and a mask layer 1j. The mask layer 1j, the substrate 1a, the first insulation layer 1b, the supporting layer 1c, the valve layer 1d, the second insulation layer 1e, the vibration layer 1f, the low electrode layer 1g, the piezoelectric actuation layer 1h and the bonding-pad layer 1i are stacked sequentially and combined into one piece. The detail structure is formed and described as follows.

Figure 2A:
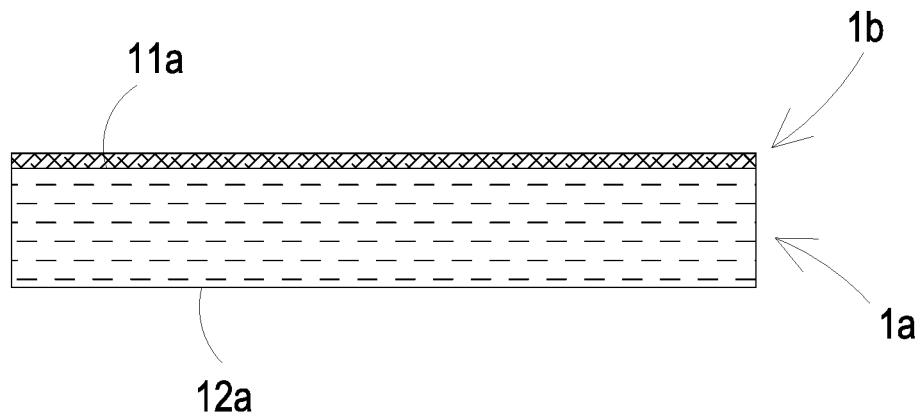
FIGS. 2A to 2Z are cross sectional views illustrating a manufacturing process of a micro channel structure according to an embodiment of the present disclosure.

Please refer to FIG. 2A. In the embodiment, the substrate 1a is made by a polysilicon material. The substrate 1a has a first surface 11a and a second surface 12a. The first surface 11a and the second surface 12a are opposite to each other. In the embodiment, the first insulation layer 1b is formed on the first surface 11a of the substrate 1a by depositing a silicon nitride material. In the embodiment, the deposition is at least one selected from the group consisting of physical vapor deposition (PVD), chemical vapor deposition (CVD) and a combination thereof, but the present disclosure is not limited thereto.

Figure 2B:
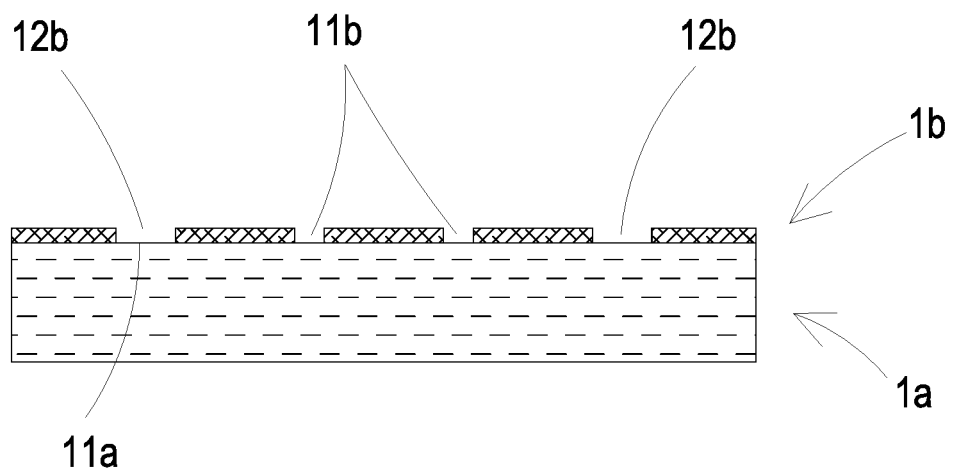

Please refer to FIG. 2B. In the embodiment, at least one first aperture 11b and at least one second aperture 12b are formed on the first insulation layer 1b by micro-lithography and etching. The at least one second aperture 12b surrounds the at least one first aperture 11b. In the embodiment, the etching is at least one selected from the group consisting of wet etching, dry etching and a combination thereof, but the present disclosure is not limited thereto.

Figure 2C:
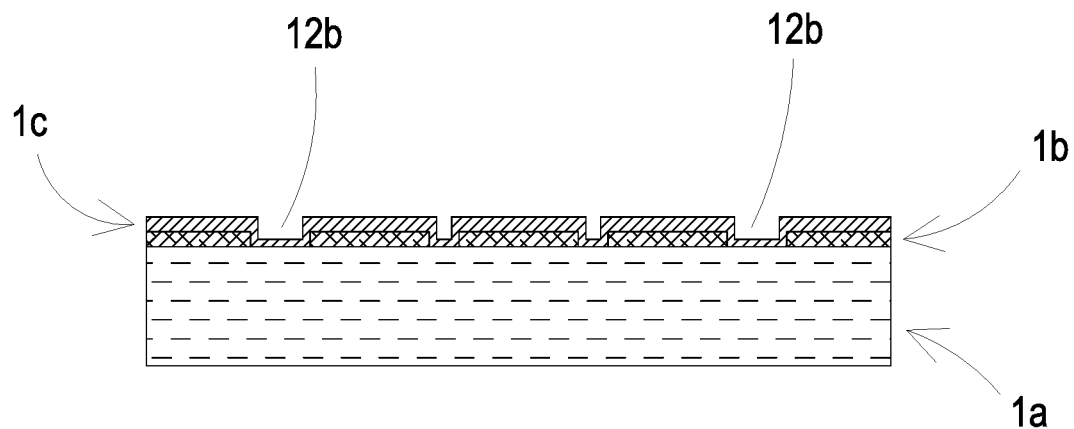
Figure 2D:
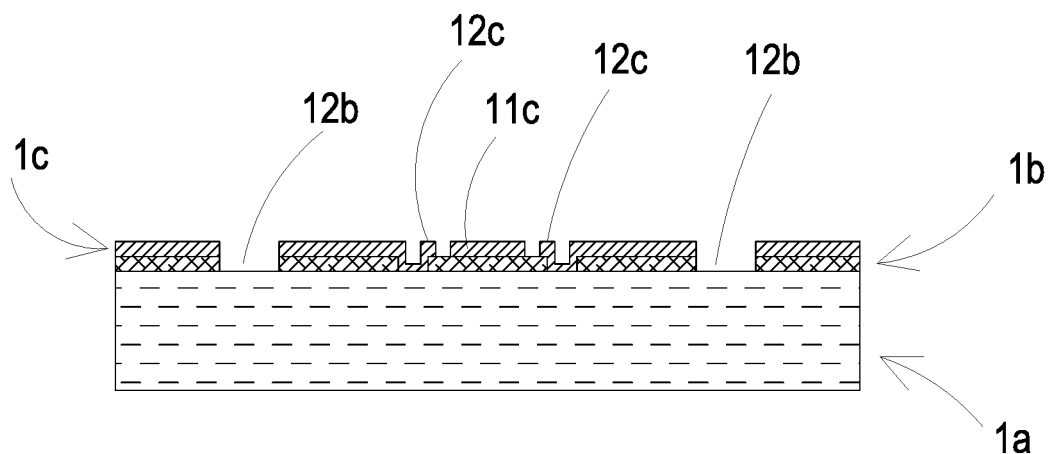
Figure 2E:
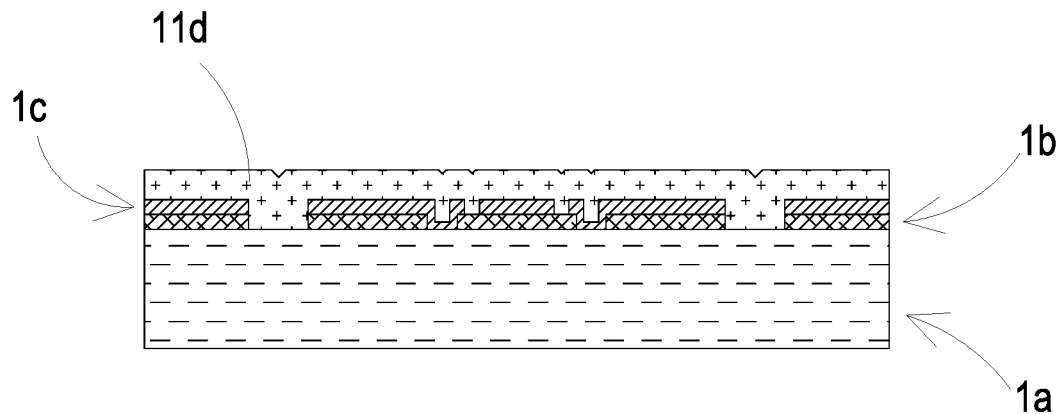

Please refer to FIGS. 2C and 2D. In the embodiment, the supporting layer 1c is formed on the first insulation layer 1b by thin film deposition (as shown in FIG. 2C). A protruding part 11c and a conductive part 12c are formed by micro-lithography and etching. The conductive part 12c surrounds the periphery of the protruding part 11c. The supporting layer 1c is etched at the part corresponding to the at least one second aperture 12b by micro-lithography and etching, so as to define and completely expose the at least one second aperture 12b (as shown in FIG. 2D).

Figure 2F:
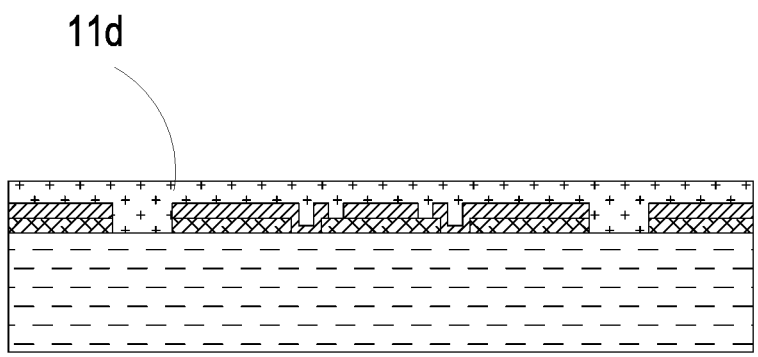
Figure 2G:
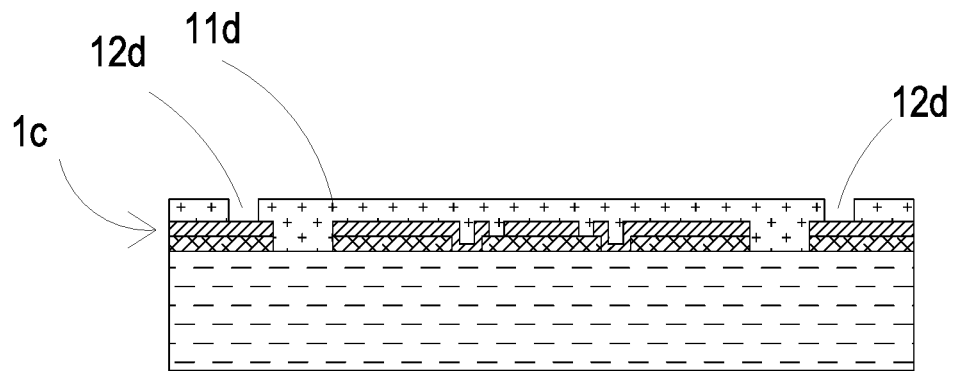
Figure 2H:
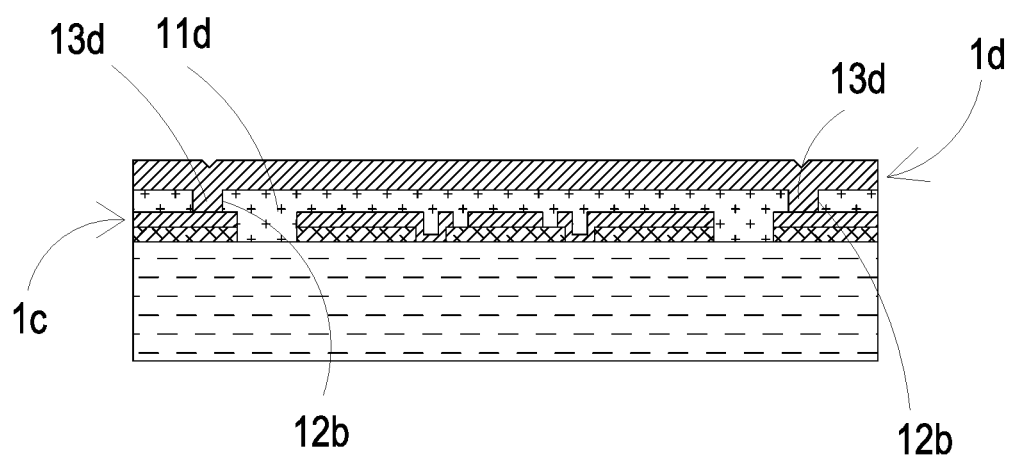
Figure 2I:
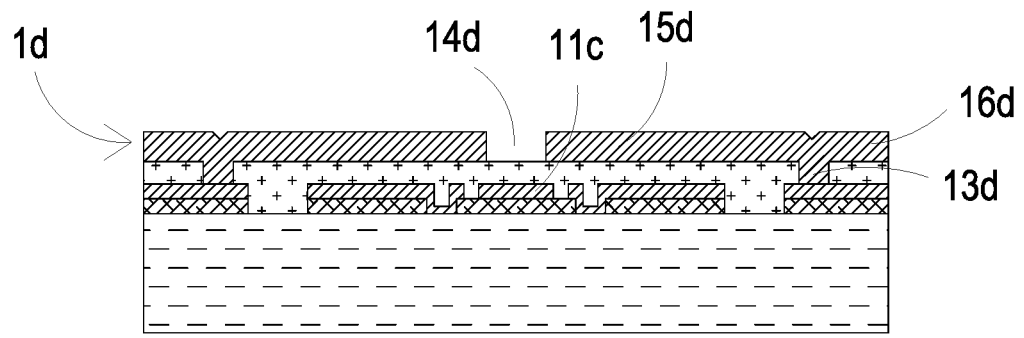
Figure 2J:
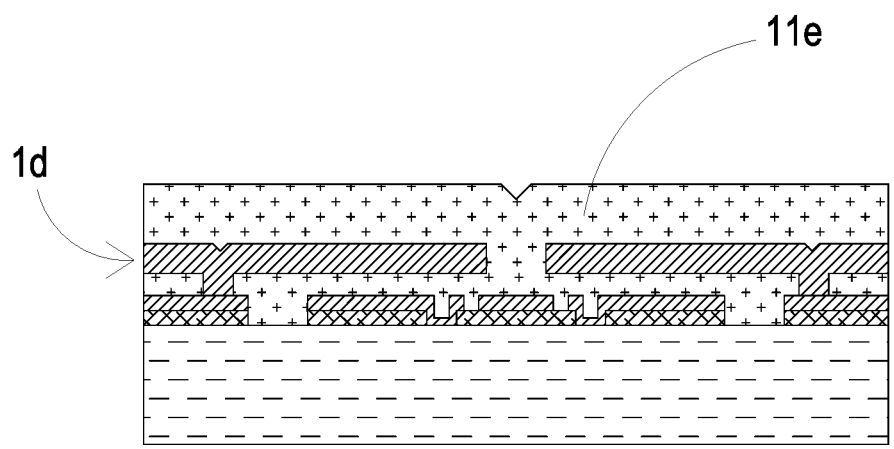

Please refer to FIGS. 2E to 2I. In the embodiment, the valve layer 1d is formed by depositing a first oxide layer 11d on the supporting layer 1c, performing planarization (as shown in FIG. 2F), etching a first anchor zone 12d (as shown in FIG. 2G), and then depositing a polysilicon material on the first oxide layer 11d. Preferably but not exclusively, the polysilicon material is heavily doped to be conductive and commonly used as a gate electrode of a metal oxide semiconductor, which is capable of sufficiently transmitting the signal at appropriate frequency. Preferably but not exclusively, in the embodiment, the planarization is performed by chemical-mechanical planarization (CMP), spin-on-glass (SOG) or reflow method, so as to eliminate step coverage on the first oxide layer 11d. It facilitates to perform photoresist coating and exposure on the first oxide layer 11d and benefits that the depositing materials is formed perfectly flat on the first oxide layer 11d. The first anchor zone 12d is etched to expose the surface of the supporting layer 1c. In other words, at least one opening is formed in the first anchor zone 12d, and has a depth extending to the surface of the supporting layer 1c. Thus, a base part 13d is formed on the first anchor zone 12d, and the valve layer 1d is aligned with and connected to the supporting layer 1c through the base part 13d. In the embodiment, the first oxide layer 11d is made by a silicon oxide material, and has a thickness ranged from 1 micrometer (μm) to 5 micrometers (μm). In other embodiment, the first oxide layer 11d is made by a phosphosilicate glass (PSG) material or a borophosphosilicate glass (BPSG) material, but the present disclosure is not limited thereto. Please refer to FIG. 2I again. In the embodiment, the valve layer 1d is etched at the position corresponding to the protruding part 11c of the supporting layer 1c by micro-lithography and etching, so as to form a hollow aperture 14d. Thus, the valve layer 1d is configured to define a movable part 15d and a fixed part 16d. The movable part 15d and the fixed part 16d are defined on opposite sides of the base part 13d. The movable part 15d extends from the periphery of the hollow aperture 14d to the base part 13d, and the fixed part 16d extends from the base part 13d and in a direction away from the movable part 15d.

Figure 2K:
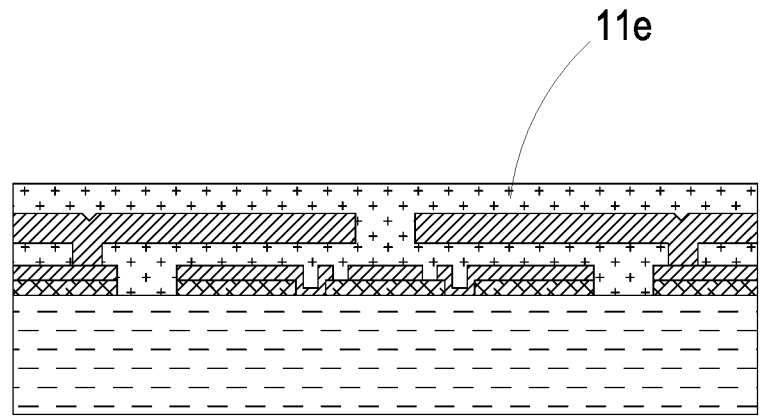
Figure 2L:
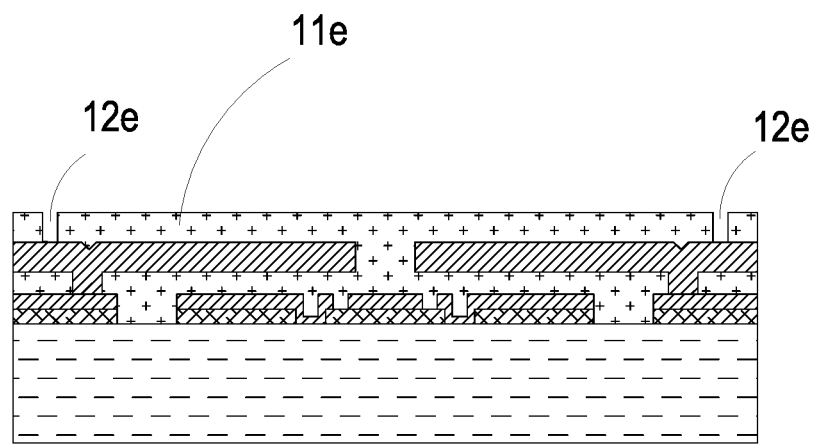
Figure 2M:
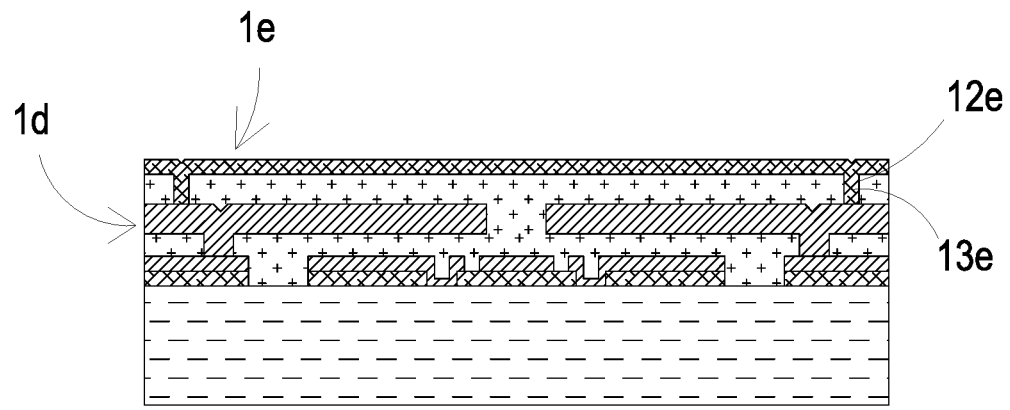
Figure 2N:
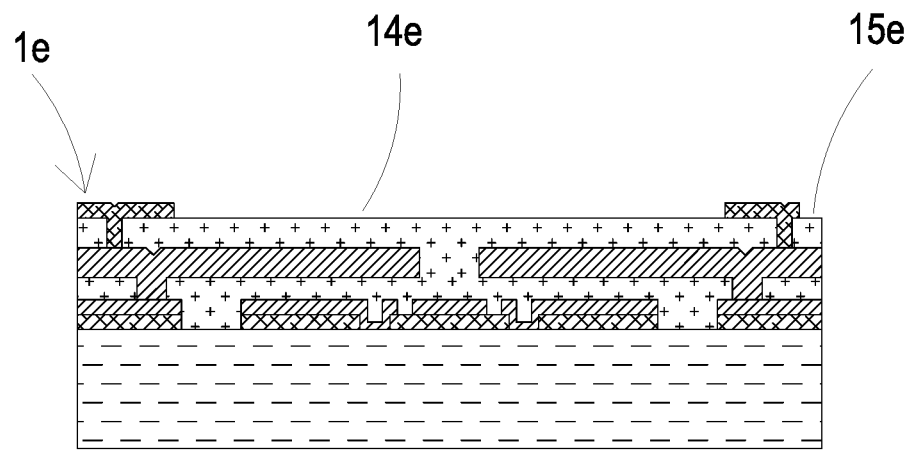

Please refer to FIGS. 2J to 2N. In the embodiment, the second insulation layer 1e is formed by depositing a second oxide layer 11e on the valve layer 1d firstly, performing planarization (as shown in FIG. 2K), etching a second anchor zone 12e (as shown in FIG. 2L), and then depositing a silicon nitride material on the second oxide layer 11e. Preferably but not exclusively, in the embodiment, the planarization is performed by chemical-mechanical planarization (CMP), spin-on-glass (SOG) or reflow method, so as to eliminate step coverage on the second oxide layer 11e. It facilitates to perform photoresist coating and exposure on the second oxide layer 11e and benefits that the depositing materials is formed perfectly flat on the second oxide layer 11e. The second anchor zone 12e is etched to expose the surface of the valve layer 1d. In other words, at least one opening is formed in the second anchor zone 12e, and has a depth extending to the surface of the valve layer 1d. Thus, a supporting part 13e is formed on the second anchor zone 12e, and the second insulation layer 1e is aligned with and connected to the valve layer 1d through the supporting part 13e. In the embodiment, the second oxide layer 11e is made by a silicon oxide material, and has a thickness ranged from 1 micrometer (μm) to 5 micrometers (μm). In other embodiment, the second oxide layer 11e is made by a phosphosilicate glass (PSG) material or a borophosphosilicate glass (BPSG) material, but the present disclosure is not limited thereto. Please refer to FIG. 2N again. In the embodiment, a vibration zone 14e and a bonding-pad zone 15e are formed on the second insulation layer 1e by micro-lithography and etching. That is, after micro-lithography, the second insulation layer 1e is etched to form two regions (i.e., the vibration zone 14e and the bonding-pad zone 15e) exposing the second oxide layer 11e.

Figure 2O:
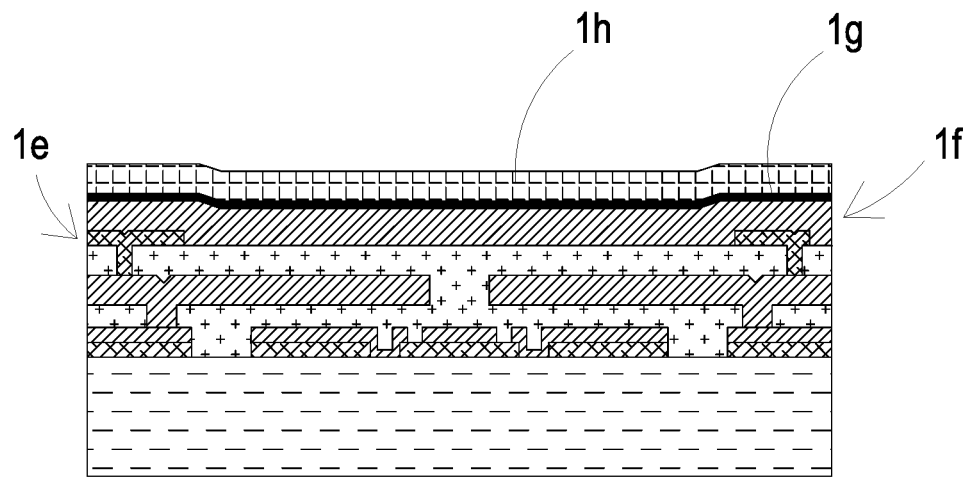
Figure 2P:
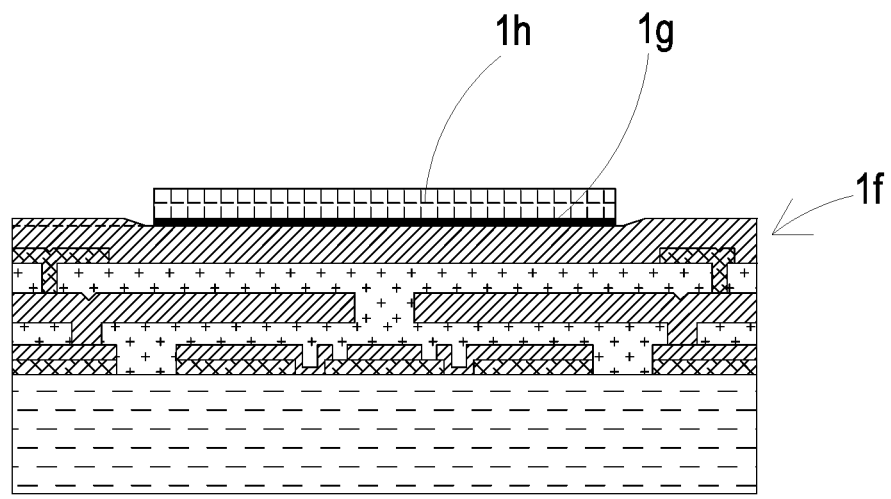

Please refer to FIGS. 2O to 2P. In the embodiment, the vibration layer 1f is formed on the second insulation layer 1e by depositing a polysilicon material. Preferably but not exclusively, the polysilicon material may be heavily doped to be conductive and commonly used as a gate electrode of a metal oxide semiconductor, which is capable of sufficiently transmitting the signal at appropriate frequency. Moreover, a lower electrode layer 1g is formed on the vibration layer 1f by depositing a metallic material. The piezoelectric actuation layer 1h is formed on the lower electrode layer 1g by depositing a piezoelectric material (as shown in FIG. 2O). In the embodiment, the vibration layer 1f has a thickness ranged from 1 micrometer (μm) to 5 micrometers (μm). In other embodiment, the piezoelectric actuation layer 1h can also be produced by a sol-gel process, but the present disclosure is not limited thereto. Please refer to FIG. 2P again. In the embodiment, the periphery of the lower electrode layer 1g and the piezoelectric actuation layer 1h are etched by micro-lithography and etching to define the piezoelectric actuation layer 1h to be a driving body and define the lower electrode layer 1g to be an electrode.

Figure 2Q:
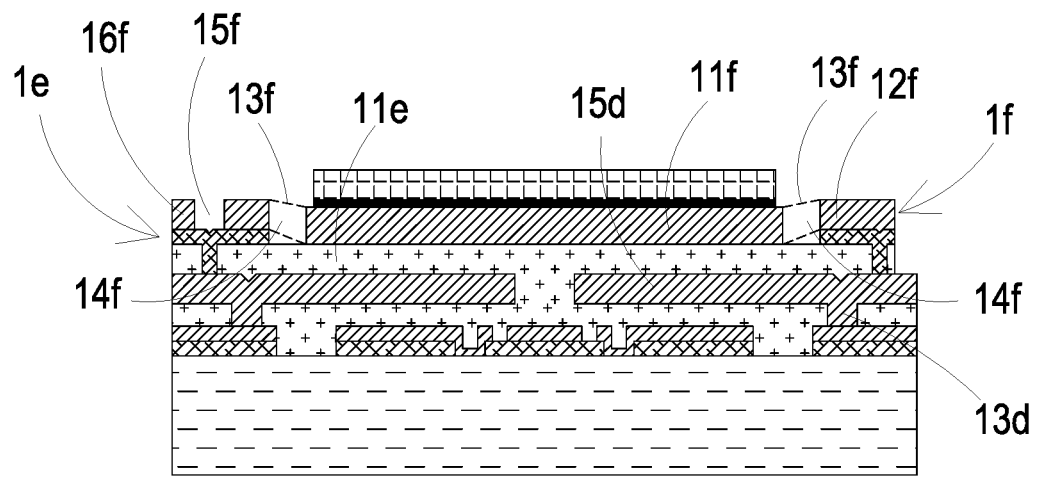
Figure 3A:
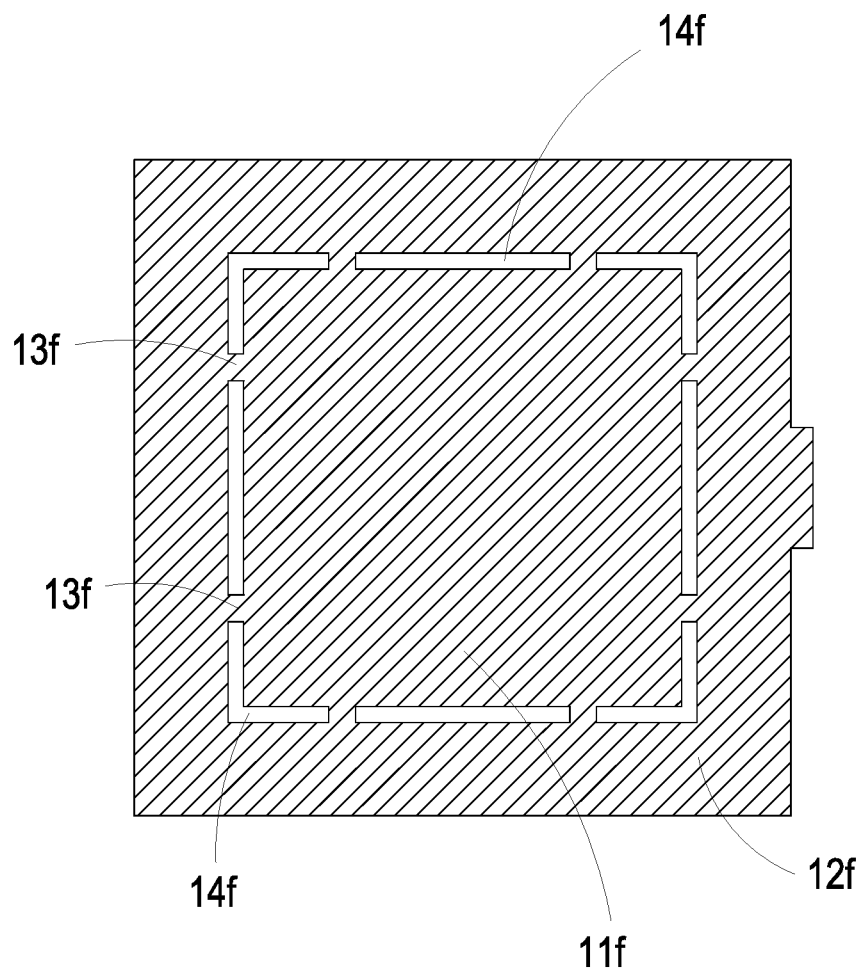
FIG. 3A is a top view illustrating a vibration layer of the micro channel structure according to an embodiment of the present disclosure.
Figure 3B:
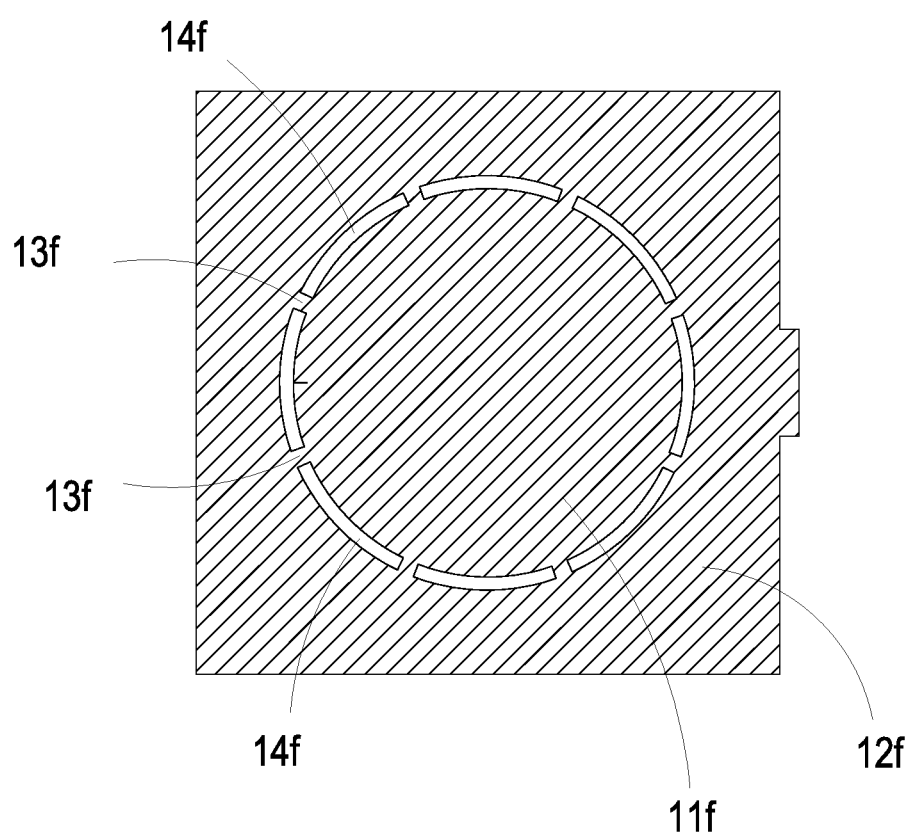
FIG. 3B is a top view illustrating a vibration layer of the micro channel structure according to another embodiment of the present disclosure.

Please refer to FIG. 2Q and FIGS. 3A and 3B. In the embodiment, the vibration layer 1f is etched by micro-lithography and etching to form a suspension part 11f, an outer frame 12f and at least one connection part 13f. At least one vacant space 14f is formed among the suspension part 11f, the outer frame 12f and the at least one connection part 13f. In the embodiment, the etching depth of the at least one vacant space 14f of the vibration layer 1f is in contact with the surface of the second oxide layer 11e. That is, the vibration layer 1f is etched to form the vacant space 14f exposing the surface of the second oxide layer 11e. In the embodiment, the at least one connection part 13f is formed between the suspension part 11f and the outer frame 12E The number of the connection parts 13f is eight. The connection parts 13f are utilized to provide a supporting force to elastically support the suspension part 11f, but the present disclosure is not limited thereto. In is noted that, in the embodiment, the suspension part 11f is in a square shape (as shown in FIG. 3A), but the present disclosure is not limited thereto. In other embodiment, the shape of the suspension part 11f is adjustable according to the practical requirements, for example, in a circular shape (as shown in FIG. 3B). It should be noted that, in the embodiment, the vibration layer if is further etched at the lateral side of the vibration layer 1f by micro-lithography and etching, so as to define a third anchor zone 15f and a bonding-pad part 16E The etching depth of the third anchor zone 15f is in contact with the surface of the second insulation layer 1e. Consequently, the bonding-pad part 16f is spaced apart and free of electrical connection with the suspension part 11f, the outer frame 12f and the at least one connection part 13f of the vibration layer 1f.

Figure 2R:
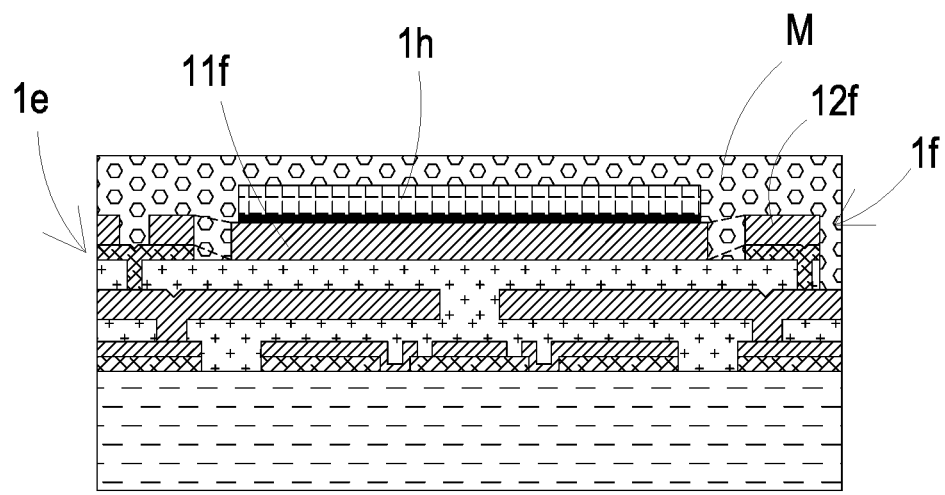
Figure 2S:
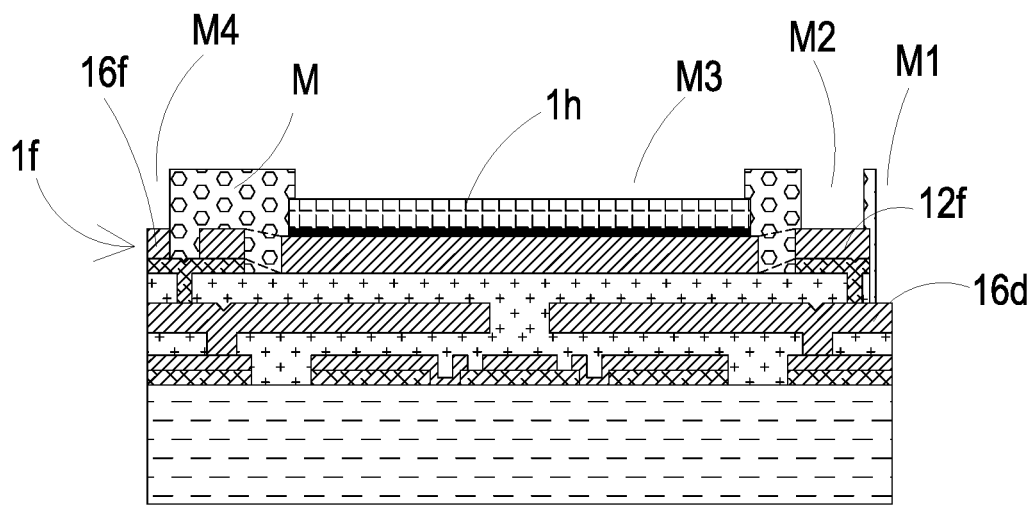

Please refer to FIGS. 2R and 2S. In the embodiment, a photoresist layer M is formed on the piezoelectric actuation layer 1h and the vibration layer 1f. Then, the photoresist layer M is etched by micro-lithography and etching to form a plurality of recess zones M1, M2, M3, and M4. The etching depth of the recessed zone M1 is in contact with the surface of the fixed part 16d of the valve layer 1d. The etching depth of the recess zone M2 is in contact with the surface of the outer frame 12f of the vibration layer 1f. The etching depth of the recess zone M3 is in contact with the surface of the piezoelectric actuator layer 1h. The etching depth of the recess zone M4 is in contact with the surface of the bonding-pad part portion 16E In the embodiment of the present disclosure, the photoresist layer M is a negative photoresist, but the present disclosure is not limited thereto.

Figure 2T:
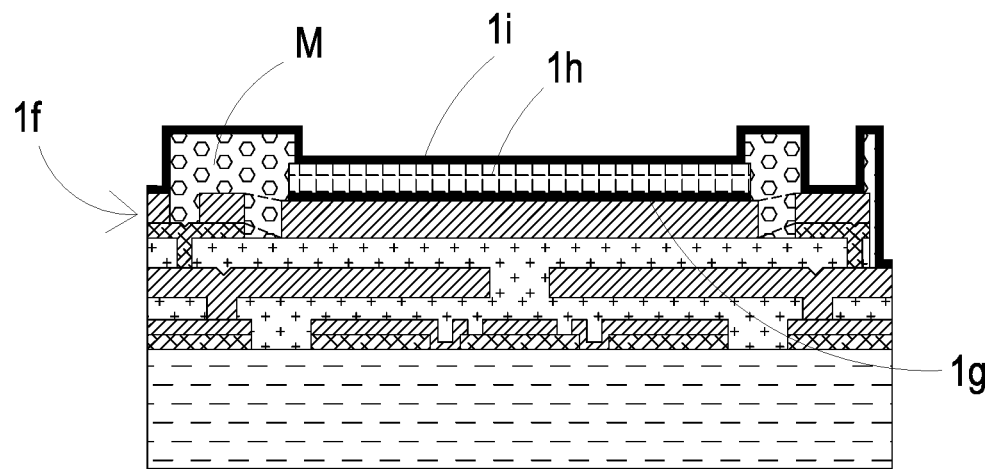
Figure 2U:
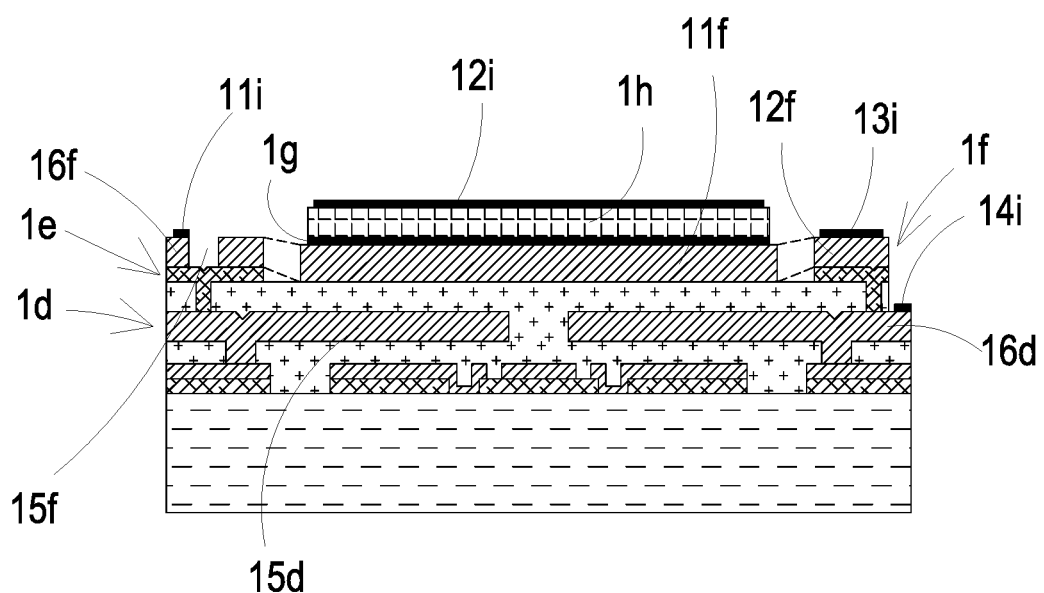

Please refer to FIGS. 2T to 2U. In the embodiment, a metal material is deposited on the fixed part 16d of the valve layer 1d, the outer frame 12f of the vibration layer 1f, the piezoelectric actuation layer, the bonding-pad part 16f and the remaining part of the photoresist M, thereby forming a bonding-pad layer 1i. Please refer to FIG. 2U again. In the embodiment, the photoresist M is removed by a lift-off process, so as to define a reference electrode bonding pad 11i, an upper electrode bonding pad 12i, a lower electrode bonding pad 13i and a valve-layer electrode bonding pad 14i on the bonding-pad layer 1i. The valve-layer electrode bonding pad 14i is formed on the fixed part 16d of the valve layer 1d. The lower electrode bonding pad 13i is formed on a lateral side of the outer frame 12f of the vibration layer 1f and adjacent to the valve-layer electrode bonding pad 14i. The upper electrode bonding pad 12i is formed on the piezoelectric actuation layer 1h. Moreover, the reference electrode bonding pad 11i is formed on the bonding-pad part 16f of the vibration layer 1f. In that, the piezoelectric actuation layer 1h is formed between the upper electrode bonding pad 12i and the lower electrode layer 1g, and the lower electrode bonding pad 13i is in electrical connection with the lower electrode layer 1g through the vibration layer 1f. It is noted that the third anchor zone 15f is disposed to make the reference electrode bonding pad 11i be isolated through the second insulation layer 1e and free of electrical connection with the lower electrode layer 1g and the lower electrode bonding pad 13i. In the above embodiment, the arrangements of the reference electrode bonding pad 11i, the upper electrode bonding pad 12i, the lower electrode bonding pad 13i and the valve-layer electrode bonding pad 14i of the bonding-pad layer 1i and the structure of the relative layers are adjustable according to the practical requirements. It shows the feasibility of bonding merely, but the present disclosure is not limited thereto.

Figure 2V:
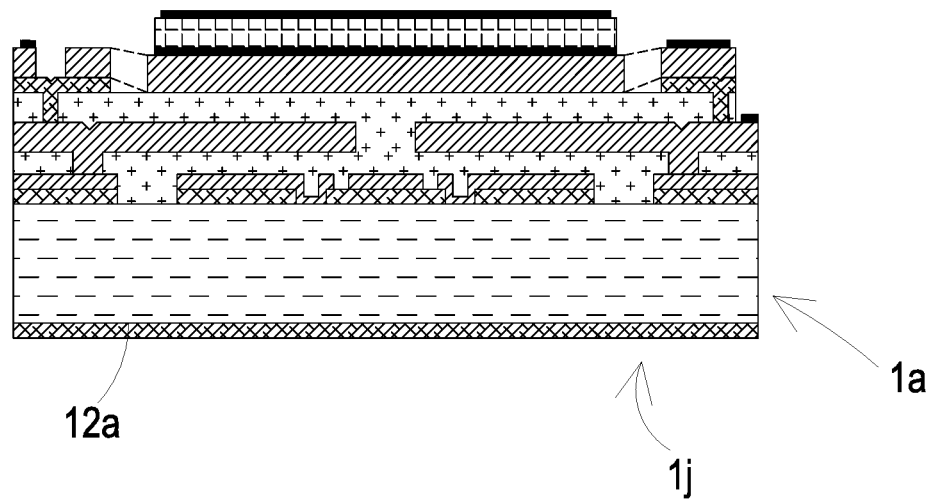
Figure 2W:
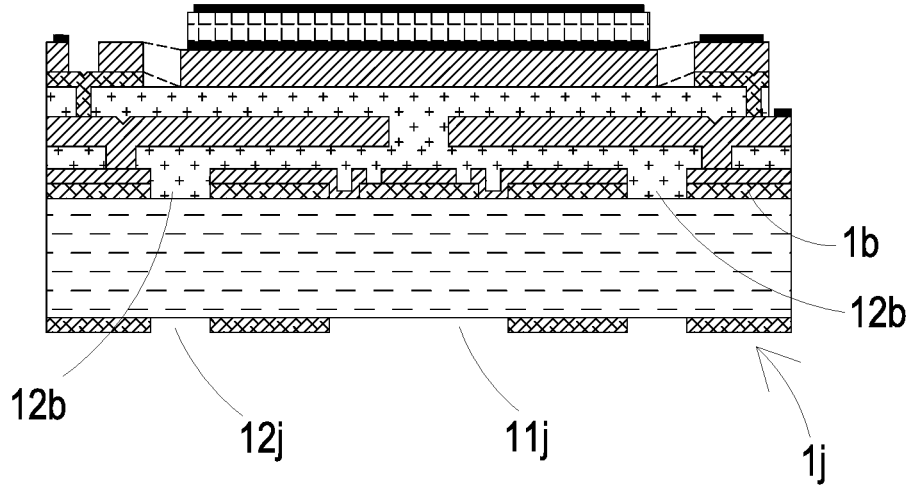

Please refer to FIGS. 2V and 2W. In the embodiment, a mask layer 1j is formed on the second surface 12a of the substrate 1a by depositing a silicon oxide material, and the mask layer 1j is etched by micro-lithography and etching to define a conductive zone 11j and at least one flow channel zone 12j. The at least one flow channel zone 12j of the mask layer 1j is spatially corresponding to the position of the at least one second aperture 12b of the first insulation layer 1b. In addition, the etching depths of the conductive zone 11j and the at least one flow channel zone 12j are in contact with the second surface 12a of the substrate 1a. That is, the mask layer 1j is etched to form at least one opening that exposes the second surface 12a of the substrate, as shown in FIG. 2W.

Figure 2X:
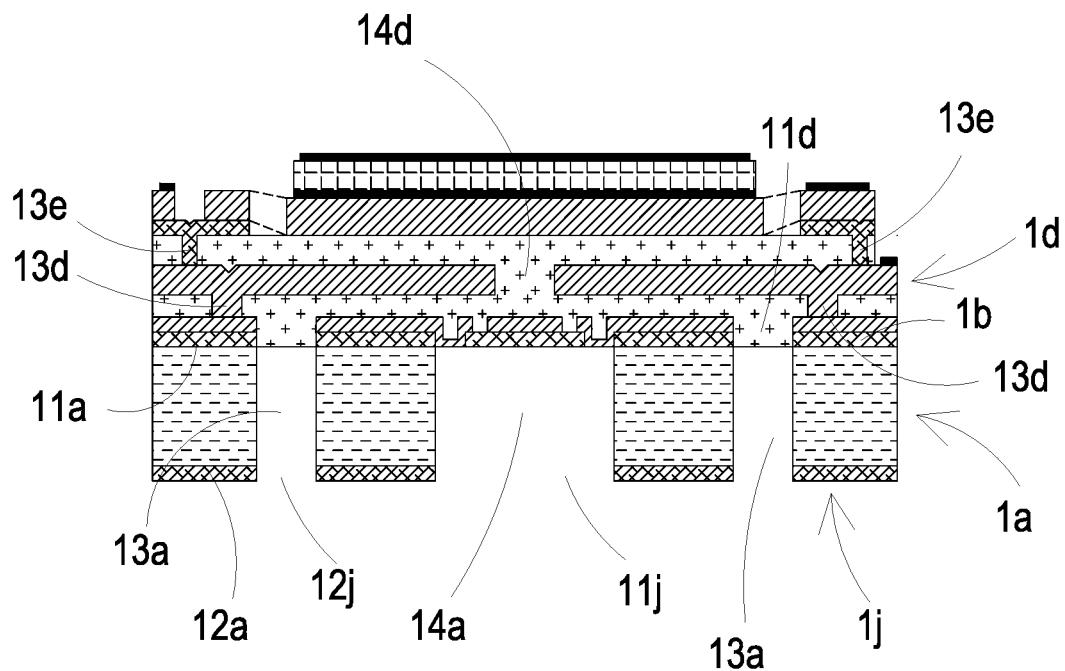
Figure 2Y:
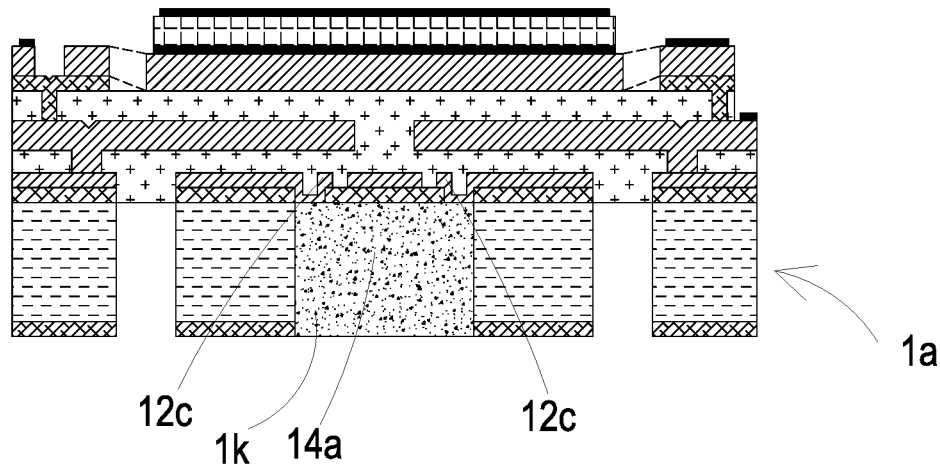
Figure 3C:
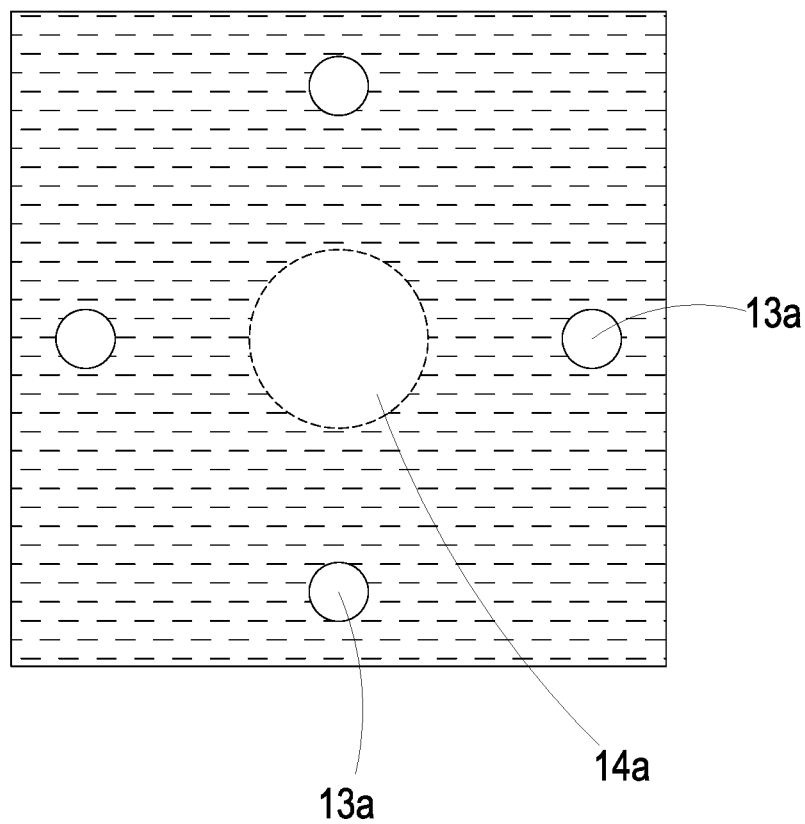
FIG. 3C is a top view illustrating a substrate of the micro channel structure according to an embodiment of the present disclosure.

Please to FIG. 2X and FIG. 3C. In the embodiment, the micro-lithography and etching is further performed through the conductive zone 11j and the at least one flow channel zone 12j of the mask layer 1j, and the etching depth is ranged from the second surface 12a and in contact with the first insulation layer 1b. In this case, the substrate 1a is etched to expose the first oxide layer 11d and the first insulation layer 1b. Thus, the substrate 1a is etched to define the at least one flow channel 13a and a receiving slot 14a. In the embodiment, the number of the flow channels 13a is four, but the present disclosure is not limited thereto. In the embodiment, the four flow channels 13a are disposed to surround the receiving slot 14a at an equiangular distance (as shown in FIG. 3C), but the present disclosure is not limited thereto. In the embodiment, the receiving slot 14a may be circle-shaped, but not limited thereto. Please refer to FIG. 2Y. In the embodiment, a base electrode bonding pad 1k is formed by filling a polymer conductive material into the receiving slot 14a of the substrate 1a, so that the base electrode bonding pad 1k and the conducive part 12c of the supporting layer 1c are in electrical connection with each other. It is noted that, in other embodiments, the base electrode bonding pad 1k can be made by any conductive material or made by a microelectroforming method, but the present disclosure is not limited thereto. The position of the base electrode bonding pad 1k is adjustable according to the practical requirements.

Figure 2Z:
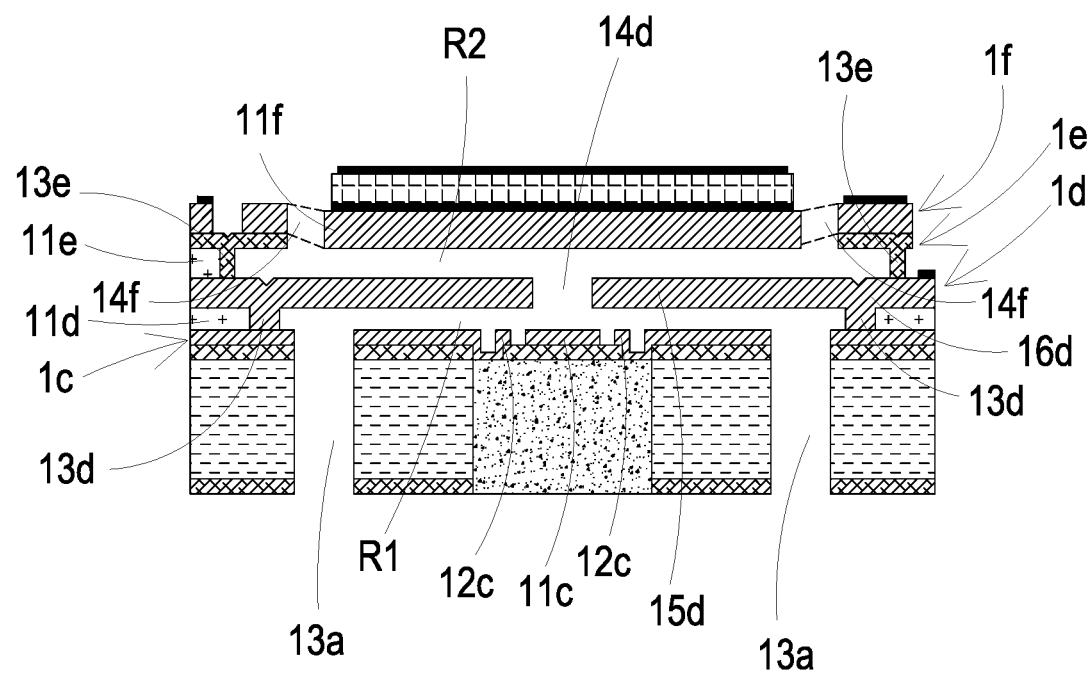

Please refer to FIG. 2Z. In the embodiment, the micro-lithography and etching is further performed. During an etching process, the first oxide layer 11d surrounded by the base part 13d of the valve layer 1d is released and removed to define a first chamber R1, and the second oxide layer 11e surrounded by the supporting part 13e of the second insulation layer 1e is released and removed to define a second chamber R2. Namely, the etching liquid flows to etch the first oxide layer 11d surrounded by the base part 13d of the valve layer 1d through the at least one flow channel 13a of the substrate 1a, so that the first oxide layer 11d is released and removed to define the first chamber R1. Moreover, the etching liquid flows to etch the second oxide layer 11e surrounded by the supporting part 13e of the second insulation layer 1e through the at least one vacant space 14f, so that the second oxide layer 11e is released and removed to define the second chamber R2 and the second oxide layer 11e located at the hollow aperture 14d is released and removed. Consequently, the hollow aperture 14d is in fluid communication with the first chamber R1 and the second chamber R2, and the first chamber R1 is in fluid communication with the at least one flow channel 13a of the substrate 1a. In the embodiment, the first chamber R1 has a depth ranged between the movable part 15d of the valve layer 1d and the supporting layer 1c. Preferably but not exclusively, the depth of the first chamber R1 is ranged from 1 micrometer (µm) to 5 micrometers (µm). In addition, the second chamber R2 has a depth ranged between the movable part 15d of the valve layer 1d and the suspension part 11f of the vibration layer 1f. Preferably but not exclusively, the depth of the second chamber R2 is ranged from 1 micrometer (µm) to 5 micrometers (µm). Furthermore, it should be noted that the micro channel structure 1 of the present disclosure has the base part 13d disposed in the valve layer 1d and the supporting part 13e disposed in the second insulation layer 1e, so as to limit the oxide etching region of the first oxide layer 11d and the second oxide layer 11e. In the etching process for removing the first oxide layer 11d and the second oxide layer 11e, since few and small apertures (e.g., the flow channel 13a and the vacant space 14f) are formed on the micro-channel structure 1 constructed with miniature size, the etching time is forced to be elongated. By the barrier of the base part 13d of the valve layer 1d and the supporting part 13e of the second insulation layer 1e, the side etching of the first chamber R1 and the second chamber R2 can be avoided, by which the desired dimension of both the first chamber R1 and the second chamber R2 can be formed with stability. It achieves extremely progressive benefits.

According to the above description, it can be understood that the micro channel structure 1 includes the mask layer 1j, the substrate 1a, the first insulation layer 1b, the supporting layer 1c, the valve layer 1d, the second insulation layer 1e, the vibration layer 1f, and the lower electrode layer 1g, the piezoelectric actuation layer 1h and the bonding-pad layer 1i sequentially stacked and combined to form an integrated miniaturized structure. Thereafter, the actions of the micro channel structure 1 will be described in detail as follows.

Figure 4A:
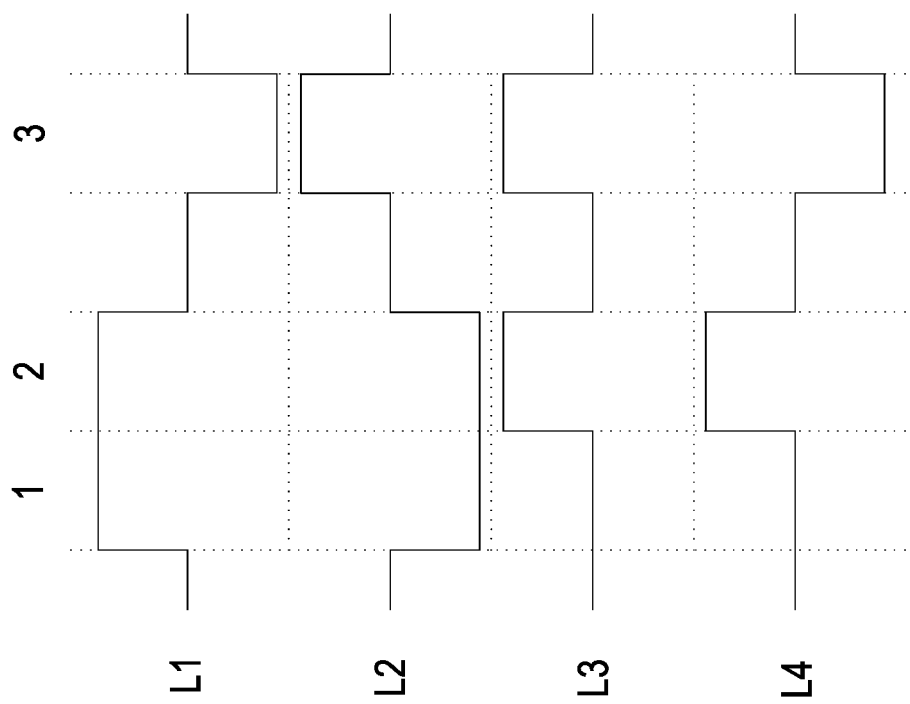
FIG. 4A is a schematic diagram showing driving power sources having different phases to drive the micro channel structure of the present disclosure.

Please refer to FIG. 1 and FIG. 4A. In the embodiment, the upper electrode bonding pad 12i is connected to a circuit (not shown), which can be made for example by conventional wire bonding, so as to form a first loop circuit L1. The lower electrode bonding pad 13*i* is connected to a circuit (not shown), which can be made for example by conventional wire bonding, so as to form a second loop circuit L2. The valve-layer electrode bonding pad 14*i* and the reference electrode bonding pad 11*i* are connected to a circuit (not shown), which can be made for example by conventional wire bonding, so as to form a third loop circuit L3. The base electrode bonding pad 1*k* and the reference electrode bonding pad 11*i* are connected to a circuit (not shown), which can be made for example by conventional wire bonding, so as to form a fourth loop circuit L4. In the embodiment, driving power sources having different phases are provided to the first loop circuit L1, the second loop circuit L2, the third loop circuit L3 and the fourth loop circuit L4. By utilizing the principle of likes repeal and opposites attract, the suspension part 11*f* of the vibration layer 1*f*, the movable part 15*d* of the valve layer 1*d* and the substrate 1*a* are controlled to move relatively, so as to achieve fluid transportation. It is noted that the depths of the first chamber R1 and the second chamber R2 is extremely small, and thus the electrostatic force among the substrate 1*a*, the valve layer 1*d* and the vibration layer 1*f* is quite large. Thus, the micro channel structure 1 not only reliably controls the resonance frequency of the valve layer 1*d* and the vibration layer 1*f* to transport the fluid, but also operates in accordance with the electric charges of the substrate 1*a* and the valve layer 1*d*. It facilitates to achieve the feasibility and transportation efficiency of the miniaturized micro channel structure 1.

Figure 4B:
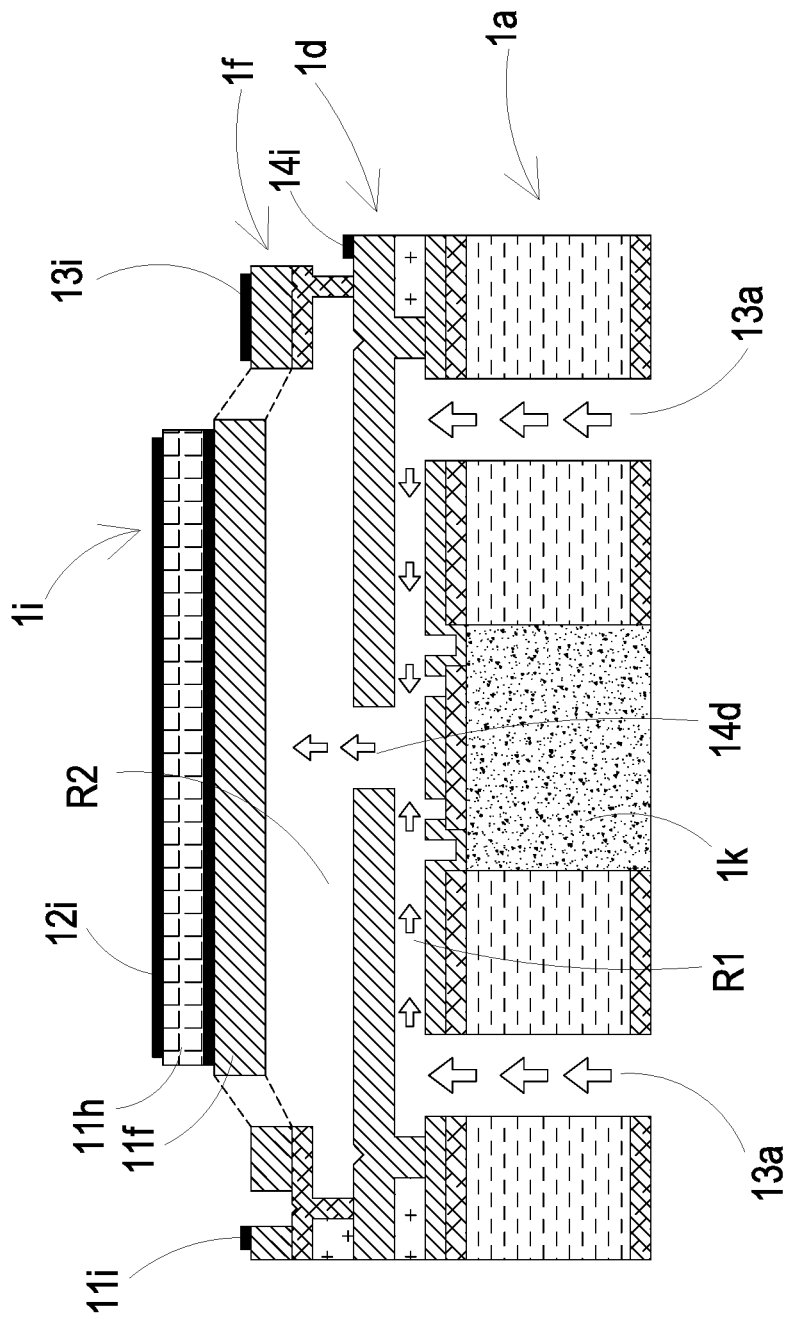
Figure 4D:
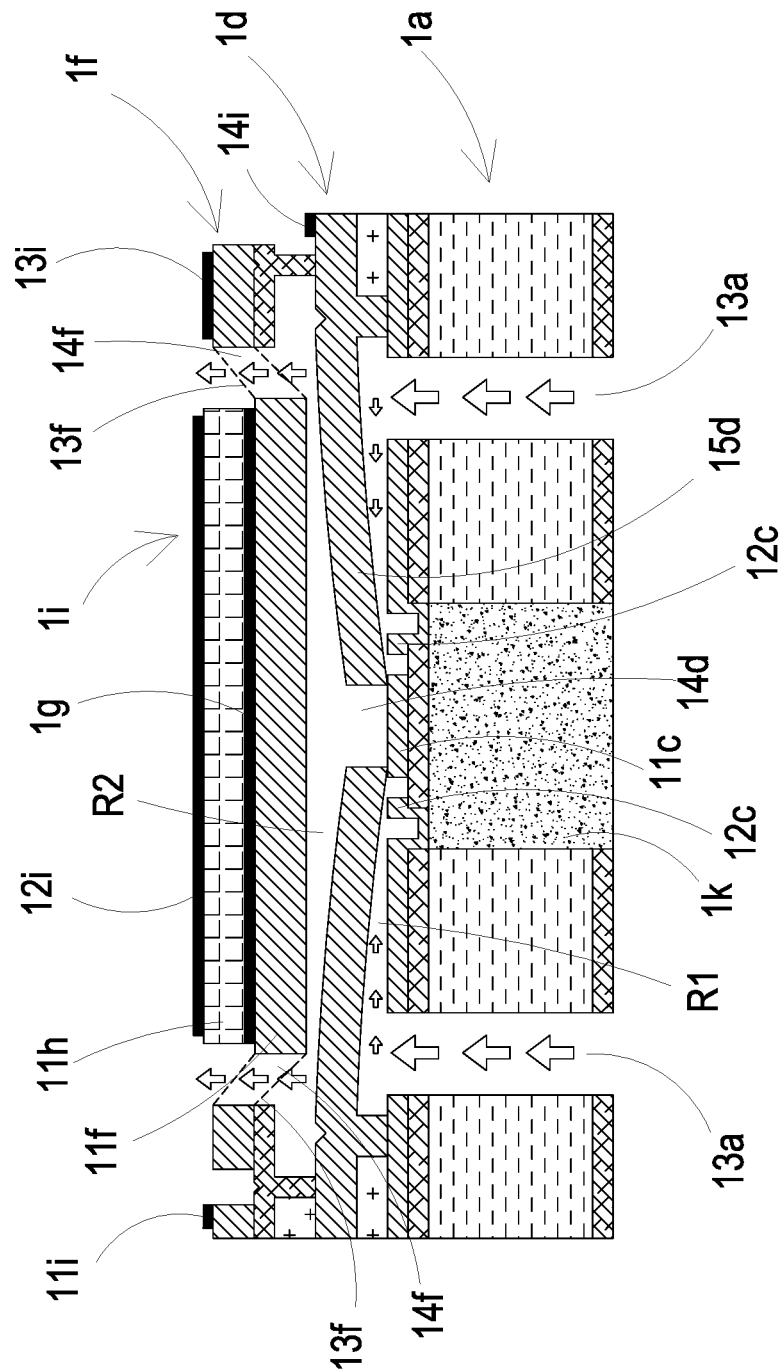

Please refer to FIGS. 4A and 4B. In the embodiment, the actions of the micro channel structure 1 are described as follows. Firstly, a positive voltage is applied to the first loop circuit L1 and a negative voltage is applied to the second loop circuit L2. Consequently, the piezoelectric actuation layer 1*h* drives the suspension part 11*f* of the vibration layer 1*f* to displace in a direction away from the substrate 1*a*. Thus, a fluid, for example gas or liquid, is inhaled from the exterior into the micro channel structure 1 through the at least one flow channel 13*a*. The fluid inhaled into the micro channel structure 1 flows through the first chamber R1 and the hollow aperture 14*d* sequentially, and is converged in the second chamber R2. Please refer to FIGS. 4A and 4C. A positive voltage is further applied to the third loop circuit L3 and the fourth loop circuit L4 to make the movable part 15*d* of the valve layer 1*d* and the conductive part 12*c* of the supporting layer 1*c* have identical charges, respectively, and the movable part 15*d* of the valve layer 1*d* and the conductive part 12*c* of the supporting layer 1*c* having identical charges are repelled with each other to move. Namely, the moveable part 15*d* of the valve layer 1*d* is displaced in the direction away from the substrate 1*a*. As shown in FIG. 4C, the suspension part 11*f* of the vibration layer 1*f* and the movable part 15*d* of the valve layer 1*d* are both displaced upwardly. Thus, the fluid is inhaled from the exterior into the micro channel structure 1 through the at least one flow channel 13*a* continuously, and a part of the fluid converged in the second chamber R2 is compressed to flow toward the periphery of the second chamber R2. Please refer to FIGS. 4A and 4D. Finally, electrical properties of the first loop circuit L1, the second loop circuit L2, the third loop circuit L3 and the fourth loop circuit L4 are changed respectively. A negative voltage is applied to the first loop circuit L1 and a positive voltage is applied to the second loop circuit L2. Consequently, the suspension part 11*f* of the vibration layer 1*f* is displaced in a direction toward the substrate 1*a*. At the same time, a positive voltage is applied to the third loop circuit L3 and a negative voltage is applied to the fourth loop circuit L4 to make the movable part 15*d* of the valve layer 1*d* and the conductive part 12*c* of the supporting layer 1*c* have opposite charges, respectively. Consequently, the movable part 15*d* of the valve layer 1*d* and the conductive part 12*c* of the supporting layer 1*c* having opposite charges are attracted with each other to move. Namely, the moveable part 15*d* of the valve layer 1*d* is displaced in the direction toward the substrate 1*a*. As shown in FIG. 4D, the suspension part 11*f* of the vibration layer 1*f* and the movable part 15*d* of the valve layer 1*d* are displaced downwardly. Thus, the movable part 15*d* of the valve layer 1*d* is attracted by the conductive part 12*c* and abuts against the protruding part 11*c* of the supporting layer 1*c*. The edge of the hollow aperture 14*d* is sealed by a top surface of the protruding part 11*c*. The hollow aperture 14*d* of the valve layer 1*d* is thus closed by the protruding part 11*c*, the fluid inhaled into the interior of the micro channel structure 1 fails to enter the second chamber R2, and the volume of the second chamber R2 is compressed by the suspension part 11*f* of the vibration layer 1*f*, so that the fluid converged in the second chamber R2 is discharged out of the micro channel structure 1 through the at least one vacant space 14*f* to achieve fluid transportation of the micro channel structure 1. The actions for transporting single fluid by the micro channel structure 1 are described as the above. Repeating the above described actions of FIGS. 4B to 4D, the micro channel structure 1 can be implanted to transport the fluid at high speed, and the operation of the micro channel structure 1 to continuously transport the fluid is achieved.

It should be noted that the structure and the operation of the micro channel structure 1 of the present disclosure can be understood according to the above descriptions. In the embodiment, with the arrangement of the protruding part 11*c* of the supporting layer 1*c*, the movable part 15*d* of the valve layer 1*d* may be displaced in the direction toward the substrate 1*a* and further abuts against the protruding part 11*c* of the supporting layer 1*c*, thereby ensuring the hollow aperture 14*d* not in fluid communication with the first chamber R1 and the at least one flow channel 13*a*. In that, the first chamber R1 and the second chamber R2 are blocked and not in fluid communication with each other. It facilitates the micro channel structure 1 to be applied for transporting a low-density fluid. In other embodiments, the protruding part 11*c* of the supporting layer 1*c* can be omitted to perform the fluid transportation of the micro channel structure 1. Moreover, in the embodiment, since the conductive part 12*c* of the supporting layer 1*c* surrounds the periphery of the protruding part 11*c*, when the movable part 15*d* of the valve layer 1*d* and the conductive part 12*c* having opposite charges are attracted with each other to move, it prevents the conductive part 12*c* from contacting with the front end of the moveable part 15*d*, and it avoids to cause a short circuit. Moreover, the front end of the movable part 15*d* can be attached to the protruding part 11*c* of the support layer 1*c* easily to close the hollow aperture 14*d* of the valve layer 1*d*. On the other hand, in the embodiment, after the valve layer 1*d* is planarized, a surface treatment can be further performed. Preferably but not exclusively, the capillary force of the surface can be reduced by applying plasma or polymer material to improve the stiction issue of the suspension structure, so that the valve layer 1*d* can be displaced easily between the first chamber R1 and the second chamber R2.

In summary, the present disclosure provides a micro channel structure. The micro channel structure is mainly produced by a semiconductor process. By providing driving power sources having different phases to the upper electrode bonding pad, the lower electrode bonding pad, the valve-layer electrode bonding pad and the base electrode bonding pad of the substrate, and utilizing the principle of likes repeal and opposites attract, the suspension part of the vibration layer, the movable part of the valve layer and the substrate are controlled to move relatively, so as to achieve fluid transportation. In this way, the miniaturized micro channel structure can overcome the electrostatic force in the extremely shallow chamber structure, it facilitates to achieve the feasibility of the fluid transportation and the great transporting efficiency in an extremely miniaturized structure. It is extremely valuable for the use of the industry, and it is submitted in accordance with the law.

While the disclosure has been described in terms of what is presently considered to be the most practical and preferred embodiments, it is to be understood that the disclosure needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A micro channel structure comprising:
   a substrate having a first surface, a second surface, at least one flow channel and a receiving slot, wherein the at least one flow channel and the receiving slot are formed by etching;
   a first insulation layer formed on the first surface of the substrate by deposition and etched to expose the at least one flow channel of the substrate;
   a supporting layer formed on the first insulation layer by deposition, having a protruding part and a conductive part formed by etching and etched to expose the at least one flow channel of the substrate;
   a valve layer formed on the supporting layer by deposition and having a base part with a height, a movable part, a fixed part, and a hollow aperture formed by etching, wherein a first chamber is formed within the interior of the base part, the hollow aperture is formed on the valve layer and located at a position corresponding to the protruding part of the supporting layer, the hollow aperture and the first chamber are in fluid communication with each other, the movable part extends from the periphery of the hollow aperture to the base part, and the fixed part extends from the base part and away from the movable part;
   a second insulation layer formed on the valve layer by deposition and having a supporting part with a height formed by etching, wherein a second chamber is formed within the interior of the supporting part, and the second chamber and the first chamber are in fluid communication with each other through the hollow aperture of the valve layer;
   a vibration layer formed on the second insulation layer by deposition and having a suspension part, an outer frame, at least one connection part and a bonding-pad part formed by etching, wherein the at least one connection part is formed between the suspension part and the outer frame, to provide a supporting force to elastically support the suspension part, at least one vacant space is formed among the suspension part, the outer frame and the at least one connection part, and the bonding-pad part is spaced apart and free of electrical connection with the suspension part, the outer frame and the at least one connection part;
   a lower electrode layer disposed on the vibration layer by deposition and formed on the suspension part by etching;
   a piezoelectric actuation layer formed on the lower electrode layer by deposition and etching;
   a bonding-pad layer formed on the valve layer, the vibration layer and the piezoelectric actuation layer by deposition and etching, wherein a reference electrode bonding pad is formed on the bonding-pad part of the vibration layer, an upper electrode bonding pad is formed on the piezoelectric actuation layer, a lower electrode bonding pad is formed on a lateral side of the outer frame of the vibration layer, and a valve-layer electrode bonding pad is formed on the fixed part of the valve layer; and
   a mask layer formed on the second surface of the substrate by deposition and etched to expose the at least one flow channel and the receiving slot of the substrate, wherein the receiving slot and the conducive part of the supporting layer are in electrical connection with each other, and a base electrode bonding pad is formed by filling a polymer conductive material into the receiving slot, so that the base electrode bonding pad and the conductive part of the supporting layer are in electrical connection with each other;
   wherein driving power sources having different phases are provided to the reference electrode bonding pad, the upper electrode bonding pad, the lower electrode bonding pad, the valve-layer electrode bonding pad and the base electrode bonding pad, so as to drive and control the suspension part of the vibration layer to displace upwardly and downwardly, and a relative displacement is generated between the movable part of the valve layer and the conductive part of the supporting layer, so that a fluid is inhaled through the at least one flow channel, flows into the first chamber, is converged in the second chamber through the hollow aperture of the valve layer, and is compressed to be discharged out to achieve fluid transportation.

2. The micro channel structure according to claim 1, wherein the substrate, the valve layer and the vibration layer are made by a polysilicon material.

3. The micro channel structure according to claim 1, wherein the first insulation layer and the second insulation layer are made by a silicon nitride material.

4. The micro channel structure according to claim 1, wherein the bonding-pad layer is made by a metallic material.

5. The micro channel structure according to claim 1, wherein
   the upper electrode bonding pad is configured to form a first loop circuit;
   the lower electrode bonding pad is configured to form a second loop circuit, wherein opposite charges are provided to the first loop circuit and the second loop circuit, respectively, and the piezoelectric actuation layer drives and controls the suspension part of the vibration layer to displace upwardly and downwardly;
   the valve-layer electrode bonding pad and the reference electrode bonding pad are configured to form a third loop circuit; and
   the base electrode bonding pad and the reference electrode bonding pad are configured to form a fourth loop circuit, wherein identical charges are provided to the third loop circuit and the fourth loop circuit, respectively, thereby generating the relative displacement between the movable part of the valve layer and the conductive part of the supporting layer as a repelling displacement, wherein opposite charges are provided to the third loop circuit and the fourth loop circuit, respectively, thereby generating the relative displacement between the movable part of the valve layer and the conductive part of the supporting layer as an attracting displacement.

6. The micro channel structure according to claim 5, wherein a positive voltage is applied to the first loop circuit and a negative voltage is applied to the second loop circuit, so that the piezoelectric actuation layer drives the suspension part of the vibration layer to displace in a direction away from the substrate.

7. The micro channel structure according to claim 5, wherein a negative voltage is applied to the first loop circuit and a positive voltage is applied to the second loop circuit, so that the piezoelectric actuation layer drives the suspension part of the vibration layer to displace in a direction toward the substrate.

8. The micro channel structure according to claim 5, wherein a positive voltage is applied to the third loop circuit and the fourth loop circuit to make the movable part of the valve layer and the conductive part of the supporting layer have identical charges, so that the movable part of the valve layer and the conductive part of the supporting layer having identical charges are repelled with each other to move, thereby making the moveable part of the valve layer displaced in the direction away from the substrate.

9. The micro channel structure according to claim 5, wherein a positive voltage is applied to the third loop circuit and a negative voltage is applied to the fourth loop circuit to make the movable part of the valve layer and the conductive part of the supporting layer have opposite charges, so that the movable part of the valve layer and the conductive part of the supporting layer having opposite charges are attracted with each other to move, thereby making the moveable part of the valve layer displaced in the direction toward the substrate.

10. The micro channel structure according to claim 5, wherein
a positive voltage is applied to the first loop circuit and a negative voltage is applied to the second loop circuit, so that the piezoelectric actuation layer drives the suspension part of the vibration layer to displace in a direction away from the substrate, thereby making the fluid inhaled from the exterior into the micro channel structure through the at least one flow channel, flow through the first chamber and the hollow aperture sequentially, and converged in the second chamber;
a positive voltage is applied to the third loop circuit and the fourth loop circuit to make the movable part of the valve layer and the conductive part of the supporting layer have identical charges, so that the movable part of the valve layer and the conductive part of the supporting layer having identical charges are repelled with each other to move, whereby the moveable part of the valve layer is displaced in the direction away from the substrate, the fluid is inhaled from the exterior into the micro channel structure through the at least one flow channel continuously, and a part of the converged fluid in the second chamber is compressed to flow toward the periphery of the second chamber; and then
electrical properties of the first loop circuit, the second loop circuit, the third loop circuit and the fourth loop circuit are changed respectively, wherein a negative voltage is applied to the first loop circuit, and a positive voltage is applied to the second loop circuit, so that the piezoelectric actuation layer drives the suspension part of the vibration layer to displace in a direction toward the substrate, wherein a positive voltage is applied to the third loop circuit and a negative voltage is applied to the fourth loop circuit to make the movable part of the valve layer and the conductive part of the supporting layer have opposite charges, and the movable part of the valve layer and the conductive part of the supporting layer having opposite charges are attracted with each other to move, so that the moveable part of the valve layer is displaced in the direction toward the substrate, and thus the movable part of the valve layer abuts against the protruding part of the supporting layer, thereby closing the hollow aperture of the valve layer, wherein the fluid inhaled into the interior of the micro channel structure fails to enter the second chamber, and the volume of the second chamber is compressed by the suspension part of the vibration layer, so that the fluid converged in the second chamber is discharged out of the micro channel structure through the at least one vacant space to achieve fluid transportation.

11. The micro channel structure according to claim 1, wherein the vibration layer has a thickness ranged from 1 micrometer to 5 micrometers.

12. The micro channel structure according to claim 1, wherein the first chamber has a height ranged from 1 micrometer to 5 micrometers.

13. The micro channel structure according to claim 1, wherein the second chamber has a height ranged from 1 micrometer to 5 micrometers.

14. A micro channel structure comprising:
at least one substrate having at least one first surface, at least one second surface, at least one flow channel and at least one receiving slot, wherein the at least one flow channel and the receiving slot are formed by etching;
at least one first insulation layer formed on the first surface of the substrate by deposition and etched to expose the at least one flow channel of the substrate;
at least one supporting layer formed on the first insulation layer by deposition, having at least one protruding part and at least one conductive part formed by etching and etched to expose the at least one flow channel of the substrate;
at least one valve layer formed on the supporting layer by deposition and having at least one base part with a height, at least one movable part, at least one fixed part, and at least one hollow aperture formed by etching, wherein at least one first chamber is formed within the interior of the base part, the hollow aperture is formed on the valve layer and located at a position corresponding to the protruding part of the supporting layer, the hollow aperture and the first chamber are in fluid communication with each other, the movable part extends from the periphery of the hollow aperture to the base part, and the fixed part extends from the base part and away from the movable part;
at least one second insulation layer formed on the valve layer by deposition and having at least one supporting part with a height formed by etching, wherein at least one second chamber is formed within the interior of the supporting part, and the second chamber and the first chamber are in fluid communication with each other through the hollow aperture of the valve layer;
at least one vibration layer formed on the second insulation layer by deposition and having at least one suspension part, at least one outer frame, at least one connection part and at least one bonding-pad part formed by etching, wherein the at least one connection part is formed between the suspension part and the outer frame, to provide a supporting force to elastically support the suspension part, at least one vacant space is formed among the suspension part, the outer frame and the at least one connection part, and the bonding-pad part is spaced apart and free of electrical connection with the suspension part, the outer frame and the at least one connection part;

at least one lower electrode layer disposed on the vibration layer by deposition and formed on the suspension part by etching;

at least one piezoelectric actuation layer formed on the lower electrode layer by deposition and etching;

at least one bonding-pad layer formed on the valve layer, the vibration layer and the piezoelectric actuation layer by deposition and etching, wherein at least one reference electrode bonding pad is formed on the bonding-pad part of the vibration layer, at least one upper electrode bonding pad is formed on the piezoelectric actuation layer, at least one lower electrode bonding pad is formed on a lateral side of the outer frame of the vibration layer, and at least one valve-layer electrode bonding pad is formed on the fixed part of the valve layer; and at least one mask layer formed on the second surface of the substrate by deposition and etched to expose the at least one flow channel and the receiving slot of the substrate, wherein the receiving slot and the conductive part of the supporting layer are in electrical connection with each other, and at least one base electrode bonding pad is formed by filling a polymer conductive material into the receiving slot, so that the base electrode bonding pad and the conducive part of the supporting layer are in electrical connection with each other;

wherein driving power sources having different phases are provided to the reference electrode bonding pad, the upper electrode bonding pad, the lower electrode bonding pad, the valve-layer electrode bonding pad and the base electrode bonding pad, so as to drive and control the suspension part of the vibration layer to displace upwardly and downwardly, and a relative displacement is generated between the movable part of the valve layer and the conductive part of the supporting layer, so that a fluid is inhaled through the at least one flow channel, flows into the first chamber, is converged in the second chamber through the hollow aperture of the valve layer, and is compressed to be discharged out to achieve fluid transportation.

* * * * *